(12) United States Patent
Robin et al.

(10) Patent No.: US 11,764,196 B2
(45) Date of Patent: Sep. 19, 2023

(54) OPTOELECTRONIC DEVICE COMPRISING LIGHT-EMITTING DIODES

(71) Applicant: Aledia, Echirolles (FR)

(72) Inventors: Ivan-Christophe Robin, Grenoble (FR); Erwan Dornel, Champagnier (FR); Frédéric Mercier, Saint Nicolas de Macherin (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 17/255,384

(22) PCT Filed: Jun. 24, 2019

(86) PCT No.: PCT/FR2019/051547
§ 371 (c)(1),
(2) Date: Dec. 22, 2020

(87) PCT Pub. No.: WO2020/002815
PCT Pub. Date: Jan. 2, 2020

(65) Prior Publication Data
US 2021/0193639 A1    Jun. 24, 2021

(30) Foreign Application Priority Data
Jun. 26, 2018   (FR) ...................................... 1855718

(51) Int. Cl.
*H01L 25/16*   (2023.01)
*H01L 33/50*   (2010.01)
(Continued)

(52) U.S. Cl.
CPC ........ *H01L 25/167* (2013.01); *H01L 33/0093* (2020.05); *H01L 33/505* (2013.01); *H01L 33/62* (2013.01)

(58) Field of Classification Search
None
See application file for complete search history.

(56) References Cited

U.S. PATENT DOCUMENTS 9,711,694 B2 * 7/2017 Robin ................... H01L 33/505
2011/0294240 A1 12/2011 Kim
(Continued)

FOREIGN PATENT DOCUMENTS

| EP | 3 024 030 A1 | 5/2016 |
| WO | WO 2016/034388 A1 | 3/2016 |
| WO | WO 2017/217703 A1 | 12/2017 |

OTHER PUBLICATIONS

International Search Report and Written Opinion for International Application No. PCT/FR2019/051547, dated Oct. 4, 2019.
(Continued)

*Primary Examiner* — Robert K Carpenter
(74) *Attorney, Agent, or Firm* — Wolf, Greenfield & Sacks, P.C.

(57) ABSTRACT

An optoelectronic device including a support, at least a first conductive layer covering the support, display pixels including first and second opposite surfaces, bonded to the first conductive layer, each pixel including an electronic circuit including the first surface and a third surface opposite to the first surface, the first surface being bonded to the first conductive layer, and an optoelectronic circuit bonded to the third surface and including at least two light-emitting diodes, at least one of the electrodes of each light-emitting diode being connected to the electronic circuit by the third surface, the optoelectronic circuit further comprising photoluminescent blocks covering the light-emitting diodes and conductive or semiconductor walls surrounding the photoluminescent blocks, and at least one second conductive layer electrically coupled to at least one of the pixels.

19 Claims, 15 Drawing Sheets

(51) Int. Cl.
*H01L 33/62* (2010.01)
*H01L 33/00* (2010.01)

(56) References Cited

U.S. PATENT DOCUMENTS

| | | |
|---|---|---|
| 2013/0048940 A1 | 2/2013 | Sills et al. |
| 2015/0362165 A1 | 12/2015 | Chu et al. |
| 2016/0141469 A1* | 5/2016 | Robin .................. H01L 33/502 438/29 |
| 2017/0194304 A1 | 7/2017 | Takeya et al. |

OTHER PUBLICATIONS

International Preliminary Report on Patentability for International Application No. PCT/FR2019/051547, dated Jan. 7, 2021.

* cited by examiner

OPTOELECTRONIC DEVICE COMPRISING LIGHT-EMITTING DIODES

The present patent application is a national stage filing under 35 U.S.C. § 371 of International PCT Application Serial No. PCT/FR2019/051547, filed Jun. 24, 2019, which claims priority to French patent application FR18/55718, filed Jun. 26, 2018. The contents of each of which are herein incorporated by reference in their entireties.

BACKGROUND

The present disclosure relates to an optoelectronic device, particularly a display screen or an image projection device, comprising light-emitting diodes based on semiconductor materials and their manufacturing methods.

DISCUSSION OF THE RELATED ART

A pixel of an image corresponds to the unit element of the image displayed by the optoelectronic device. When the optoelectronic device is a color image display screen, it generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device.

Each display sub-pixel may comprise a light source, particularly a light-emitting diode, for example, made up of semiconductor materials. A known method of manufacturing an optoelectronic device, particularly a display screen or an image projection device, comprising light-emitting diodes, called "pick and place" method, comprises manufacturing the light-emitting diodes in the form of separate components and placing each light-emitting diode at a desired position on a support which may comprise conductive tracks for the electric connection of the light-emitting diodes.

A disadvantage of such a method is that it generally requires accurately placing the light-emitting diodes on the support. This requires implementing alignment methods which are all the more complex as the dimensions of the light-emitting diodes are small.

Another disadvantage of such a method is that an increase in the resolution of the optoelectronic device results in an increase in the numbers of transfers of light-emitting diodes onto the support and thus in an increase in the duration of the optoelectronic device manufacturing, which may be incompatible with a manufacturing at an industrial scale.

To form a large light-emitting diode display made up of assembled unit light-emitting diodes, the light-emitting diodes should be assembled with control circuits which control a number of light-emitting diodes. The assemblies comprising the control circuits and the light-emitting diodes are then coupled together by wires. Such an assembly decreases the quantity of data that can be transmitted and it may be difficult to display a video flow.

For displays comprising micrometer-range light-emitting diodes, for example for formats of TV, tablet, smart phone type which are being developed by several manufacturers, an active array is necessary to display a video flow with a high resolution. Currently, active arrays for displays are formed with thin film transistors, or TFTs. TFTs generally use deposits of amorphous silicon or polysilicon on large glass surface areas and require using complex microelectronics methods on large surface areas.

It would be desirable to be able to form so-called smart pixels integrating with the light-emitting diodes, particularly of micrometer-range size, control electronics to form TFT-less active arrays. Such active arrays may be formed on very large surface areas since they are based on the electronic circuits embarked under the pixel. On the other hand, such electronic circuits may take advantage of silicon-based technologies.

SUMMARY

Thus, an object of an embodiment is to at least partly overcome the disadvantages of the previously-described optoelectronic devices comprising light-emitting diodes.

Another object of an embodiment is to decrease the number of transfers of components onto the support of the optoelectronic device during the manufacturing of the optoelectronic device.

Another object of an embodiment is to decrease accuracy constraints at the placing of components on the support of the optoelectronic device.

Another object of an embodiment is for optoelectronic devices to be capable of being manufactured at an industrial scale and at a low cost.

Another object of an embodiment is for the optoelectronic device to comprise a TFT-less active array.

Thus, an embodiment provides an optoelectronic device comprising:

a support;

at least one first electrically-conductive layer covering the support;

display pixel circuits comprising first and second opposite surface, bonded to the first electrically-conductive layer, each display pixel circuit comprising an electronic circuit comprising the first surface and a third surface opposite to the first surface, the first surface being bonded to the first electrically-conductive layer, and an optoelectronic circuit bonded to the third surface and comprising at least two light-emitting diodes, at least one of the electrodes of each light-emitting diode being connected to the electronic circuit by the third surface, the optoelectronic circuit further comprising photoluminescent blocks covering the light-emitting diodes and electrically-conductive or semiconductor walls, surrounding the photoluminescent blocks; and at least on second electrically-conductive layer electrically coupled to at least one of the display pixel circuits.

According to an embodiment, the second electrically-conductive layer at least partially covers said at least one of the display pixel circuits.

According to an embodiment, the second electrically-conductive layer is electrically coupled to the walls of said at least one of the display pixel circuits.

According to an embodiment, the second electrically-conductive layer is, for said at least one of the display pixel circuits, in contact with an electrically-conductive pad of the electronic circuit located on the side of the third surface.

According to an embodiment, the second electrically-conductive layer extends on the support and the second electrically-conductive layer is, for said at least one of the display pixel circuits, in contact with an electrically-conductive pad of the electronic circuit located on the side of the first surface.

According to an embodiment, the device further comprises a first electrically-insulating layer covering the first electrically-conductive layer between the display pixel circuits and interposed between the first electrically-insulating layer and the second electrically-conductive layer.

According to an embodiment, the device further comprises, for each display pixel circuit, a second electrically-insulating layer covering the sides of the display pixel circuit.

According to an embodiment, for each display pixel circuit, the optoelectronic circuit of the display pixel circuit comprises a first semiconductor layer supporting the walls and the photoluminescent blocks and, for each light-emitting diode, a stack resting on the first semiconductor layer on the side opposite to the photoluminescent blocks and comprising a second doped semiconductor layer of a first conductivity type, an active layer, and a third doped semiconductor layer of a second conductivity type opposite to the first conductivity type, the stacks being distinct.

According to an embodiment, each display pixel circuit comprises, for each stack, a conductive pad in contact with the first semiconductor layer and bonded to the electronic circuit of the display pixel circuit.

According to an embodiment, the device comprises at least two first separate electrically-conductive layers covering the support, display pixel circuits among the display pixel circuits being bonded to each first electrically-conductive layer, the device further comprising at least two second electrically-conductive layers, each being electrically connected to electronic circuits among the display pixel circuits.

According to an embodiment, the first two electrically-conductive layers and the second two electrically-conductive layers have the shape of parallel strips.

An embodiment also provides a method of manufacturing an optoelectronic device, comprising the steps of:

a) manufacturing display pixel circuits comprising first and second opposite surfaces and each comprising an electronic circuit comprising the first surface and a third surface opposite to the first surface, and an optoelectronic circuit bonded to the third surface and comprising at least two light-emitting diodes, at least one of the electrodes of each light-emitting diode being connected to the electronic circuit by the third surface, the optoelectronic further comprising photoluminescent blocks covering the light-emitting diodes and electrically-conductive or semiconductor walls surrounding the photoluminescent blocks;

b) manufacturing a support covered with at least one first electrically-conductive layer;

c) bonding the first surface of the electronic circuit of each display pixel circuit to the first electrically-conductive layer; and d) forming at least a second electrically-conductive layer electrically coupled to at least one of the display pixel circuits.

According to an embodiment, the second electrically-conductive layer at least partially covers said at least one of the display pixel circuits.

According to an embodiment, the second electrically-conductive layer is electrically coupled to the walls of said at least one of the display pixel circuits.

According to an embodiment, the second electrically-conductive layer is, for said at least one of the display pixel circuits, in contact with an electrically-conductive pad of the electronic circuit located on the side of the third surface.

According to an embodiment, the second electrically-conductive layer extends on the support and the second electrically-conductive layer is, for said at least one of the display pixel circuits, in contact with an electrically-conductive pad of the electronic circuit located on the side of the first surface.

According to an embodiment, the method comprises, between steps c) and d), the step of forming a first electrically-insulating layer covering the first electrically-conductive layer between the display pixel circuits and interposed between the first electrically-insulating layer and the second electrically-conductive layer.

According to an embodiment, the method comprises, before step c), the step of further forming, for each display pixel circuit, a second electrically-insulating layer covering the sides of the display pixel circuit.

According to an embodiment, step a) comprises forming, for each light-emitting diode, a stack resting on a first semiconductor layer and comprising a second doped semiconductor layer of a first conductivity type, an active layer, and a third doped semiconductor layer of a second conductivity type opposite to the first conductivity type, the stacks being distinct.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
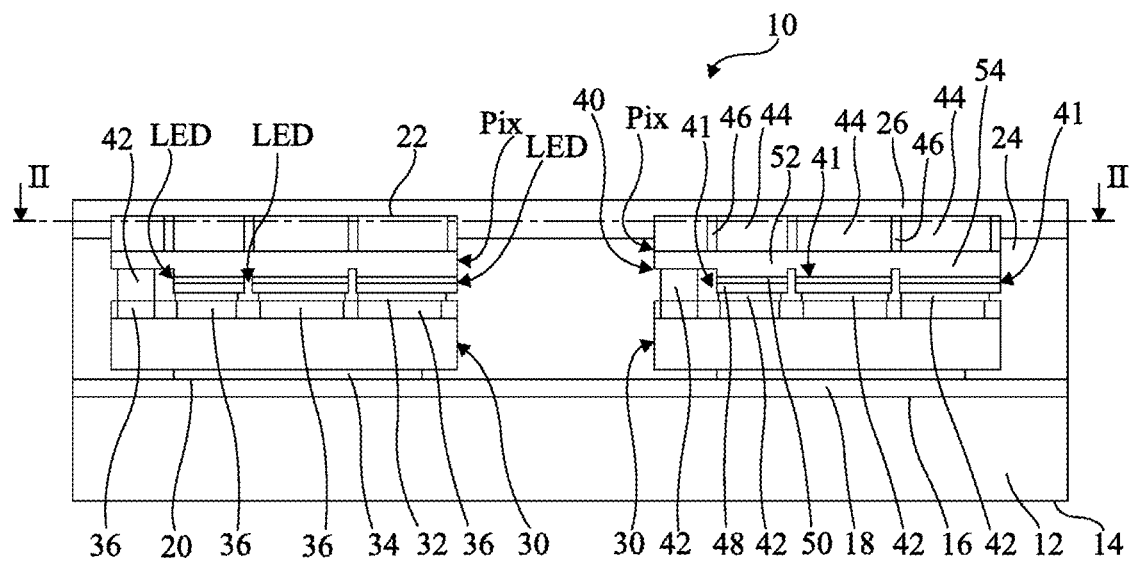
FIGS. 1 and 2 respectively are a lateral cross-section view and a top view, partial and simplified, of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the structure of a light-emitting diode is well known by those skilled in the art and has not been described in detail.

In the following description, when reference is made to terms qualifying the relative position, such as term "top", "upper", or "lower", etc., reference is made to the orientation of the drawings or to an optoelectronic device in a normal position of use. Unless otherwise indicated, the terms "substantially", "approximately", and "in the order of" are used herein to designate a tolerance of plus or minus 10%, preferably of plus or minus 5%, of the value in question. Further, the "active area" of a light-emitting diode designates the region of the light-emitting diode from which most of the electromagnetic radiation provided by the light-emitting diode is emitted.

Figure 2:
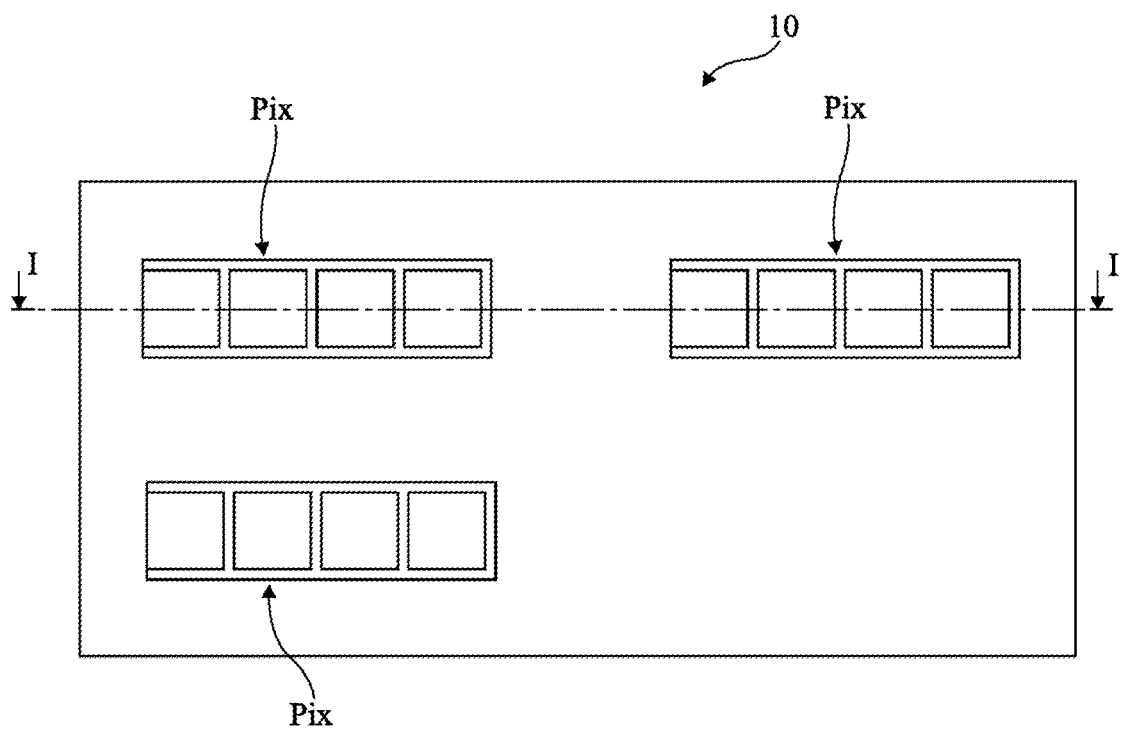

FIGS. 1 and 2 show an embodiment of an optoelectronic device 10, for example corresponding to a display screen or to an image projection device, comprising display pixels. FIG. 1 is a cross-section view of FIG. 2 along line I-I and FIG. 2 is a cross-section view of FIG. 1 along line II-II.

Device 10 comprises, from bottom to top in FIG. 1:

a support 12, comprising opposite lower and upper surfaces 14, 16, preferably parallel;

a first electrode layer 18 comprising an electrically-conductive layer covering upper surface 16;

display pixels Pix, also called display pixel circuits hereafter, resting on electrode layer 18 and in contact with electrode layer 18, two display pixels Pix being shown in FIG. 1 and three display pixels Pix being shown in FIG. 2, each display pixel Pix comprising a lower surface 20 and an upper surface 22 opposite to lower surface 20, each display pixel circuit comprising light-emitting diodes LED emitting light from upper surface 22;

an electrically-insulating layer 24 covering electrode layer 18 between display pixels Pix and covering the lateral sides of display pixels Pix; and a second electrode layer 26 comprising an electrically-conductive layer at least partially transparent to the radiations emitted by light-emitting diodes LED, conductive layer 26 covering each display pixel Pix and covering the insulating layer 24 between display pixels Pix, conductive layer 26 being in contact with the upper surface 22 of each display pixel Pix.

Each display pixel Pix comprises from bottom to top in FIG. 1:

an electronic circuit 30, called control circuit hereafter; and an optoelectronic circuit 40.

Control circuit 30 comprises lower surface 20 and an upper surface 32 opposite to lower surface 20, surfaces 20 and 32 being preferably parallel. Lower surface 20 is bonded to electrode layer 18 and is for example delimited by an electrically-conductive pad 34 electrically coupled to electrode layer 18. Control circuit 30 further comprises electrically-conductive pads 36 on the side of upper surface 32.

Optoelectronic 40 is bonded to upper surface 32 of control circuit 30. It comprises stacks 41 of semiconductor layers forming light-emitting diodes LED, preferably at least three light-emitting diodes. Optoelectronic circuit 40 is electrically coupled to electronic circuit 30 by electrically-conductive pads 42 in contact with electrically-conductive pads 36. Optoelectronic circuit 40 comprises photoluminescent blocks 44 covering light-emitting diodes LED on the side opposite to control circuit 30 and laterally separated by electrically-conductive walls 46. Preferably, each photoluminescent block 44 faces each of the light-emitting diodes LED. Walls 46 are in contact with stack 41 and in contact with second electrode layer 26. In FIG. 2, the light-emitting diodes LED and the photoluminescent blocks 44 of each display pixel Pix have been shown as being aligned. It should however be clear that the arrangement of light-emitting diodes LED and of photoluminescent blocks 44 may be different. As an example, each display pixel Pix may have, in top view, a substantially square shape, the light-emitting diodes LED and the photoluminescent blocks 44 being arranged at three of the corners of the square.

An encapsulation layer, not shown, may cover second electrode layer 26.

The lower surface 20 of electronic circuit 30 may be bonded to electrode layer 18 by a bonding material which is preferably electrically conductive.

Each light-emitting diode LED may correspond to a so-called two-dimensional light-emitting diode comprising a stack of substantially planar semiconductor layers having as an active layer the layer from which most of the radiation supplied by light-emitting diode LED is emitted. According to an embodiment, all the light-emitting diodes LED of optoelectronic circuit 40 preferably emit a light radiation substantially at the same wavelength.

According to an embodiment, stack 41 comprises, for each light-emitting diode LED, a doped semiconductor layer 48 of a first conductivity type, for example, P-type doped, in contact with a conductive pad 42, an active layer 50 in contact with semiconductor layer 48, and a doped semiconductor layer 52 of a second conductivity type opposite to the first conductivity type, for example, N-type doped, in contact with active layer 50. Optoelectronic circuit 40 further comprises a semiconductor layer 54 in contact with the semiconductor layers 52 of the light-emitting diodes and having walls 46 resting thereon. Semiconductor layer 54 is, for example, made of the same material as semiconductor layer 52. According to an embodiment, each optoelectronic circuit 40 comprises, for each light-emitting diode, a conductive pad 42 coupling the semiconductor layer 48 to electronic circuit 30, and at least one semiconductor pad 42 coupling semiconductor layer 54 directly to electronic circuit 30.

For each light-emitting diode LED, active layer 50 may comprise confinement means. As an example, layer 50 may comprise a single quantum well. It then comprises a semiconductor material different from the semiconductor material forming semiconductor layers 48 and 52 and having a bandgap smaller than that of the material forming semiconductor layers 48 and 52. Active layer 50 may comprise multiple quantum wells. It then comprises a stack of semiconductor layers forming an alternation of quantum wells and of barrier layers.

For each display pixel Pix, optoelectronic circuit 40 may be bonded to control circuit 30 by a "flip-chip" type connection. The fusible conductive elements, not shown, for example, solder balls or indium balls, which couple optoelectronic 40 to control circuit 30, ensure the mechanical connection between optoelectronic circuit 40 and control circuit 30 and further ensure the electric connection of each light-emitting diode LED of optoelectronic circuit 40 to control circuit 30. According to another embodiment, optoelectronic circuit 40 may be bonded to control circuit 30 by direct bonding. It may be a heterogeneous direct bonding. This means that metal elements of optoelectronic circuit 40 are in contact with metal elements of control circuit 30 and dielectric elements of optoelectronic circuit 40 are in contact with dielectric elements of control circuit 30.

According to an embodiment, each photoluminescent block 44 is located opposite one of the light-emitting diodes LED. Each photoluminescent block 44 comprises phosphors capable, when they are excited by the light emitted by the associated light-emitting diode LED, of emitting light at a wavelength different from the wavelength of the light emitted by the associated light-emitting diode LED. According to an embodiment, each display pixel Pix comprises at least two types of photoluminescent blocks 44. The photoluminescent block 44 of the first type is capable of converting the radiation supplied by light-emitting diodes LED into a first radiation at a first wavelength and the photoluminescent block 44 of the second type is capable of converting the radiation supplied by light-emitting diodes LED into a second radiation at a second wavelength. According to an embodiment, each display pixel Pix comprises at least three types of photoluminescent blocks 44, the photoluminescent block 44 of the third type being capable of converting the radiation supplied by the light-emitting diodes LED into a third radiation at a third wavelength. The first, second, and third wavelengths may be different.

According to an embodiment, the first wavelength corresponds to blue light and is within the range from 430 nm to 490 nm. According to an embodiment, the second wavelength corresponds to green light and is within the range from 510 nm to 570 nm. According to an embodiment, the third wavelength corresponds to red light and is within the range from 600 nm to 720 nm. The light-emitting diodes LED are for example capable of emitting a radiation in the ultraviolet range.

According to an embodiment, each display pixel Pix comprises a photoluminescent block 44 of a fourth type capable of converting the radiation supplied by light-emitting diodes LED into a fourth radiation at a fourth wavelength. The first, second, third, and fourth wavelengths may be different. According to an embodiment, the fourth wavelength corresponds to yellow light and is in the range 570 nm to 600 nm. According to another embodiment, the fourth radiation corresponds to a radiation in close infrared, particularly at a wavelength between 700 nm and 980 nm, to an ultraviolet radiation, or to white light.

Each control circuit 30 may comprise electronic components, not shown, particularly transistors, used to control the light-emitting diodes. Each control circuit 30 may comprise a semiconductor substrate having the electronic components formed inside thereof and/or on top thereof. Lower surface 20 of control circuit 30 may then correspond to the rear surface of the substrate opposite to the front surface of the substrate on the side of which the electronic components are formed. The semiconductor substrate is, for example, a substrate made of silicon, particularly, of single-crystal silicon.

Preferably, optoelectronic circuits 40 only comprise light-emitting diodes and elements of connection of the light-emitting diodes and control circuits 30 comprise all the electronic components necessary to control the light-emitting diodes of optoelectronic circuits 40. As a variation, optoelectronic circuits 40 may also comprise other electronic components in addition to the light-emitting diodes.

Optoelectronic device 10 may comprise from 10 to 109 display pixels Pix. Each display pixel Pix may occupy in top view a surface area in the range from 1 µm2 to 100 mm2. The thickness of each display pixel Pix may be in the range from 1 µm to 6 mm. The thickness of each electronic circuit 30 may be in the range from 0.5 µm to 3,000 µm. The thickness of each optoelectronic circuit 40 may be in the range from 0.2 µm to 3,000 µm.

Support 12 may be made of an electrically-insulating material, for example, comprising a polymer, particularly an epoxy resin, and in particular the FR4 material used for the manufacturing of printed circuits, or of a metallic material, for example, aluminum. The thickness of support 12 may be in the range from 10 µm to 10 mm.

Conductive layer 18 preferably corresponds to a metal layer, for example, aluminum, silver, copper, or zinc. The thickness of conductive layer 18 may be in the range from 0.5 µm to 1,000 µm.

Insulating layer 24 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride ($SiO_xN_y$, where x may be approximately equal to ½ and y may be approximately equal to 1, for example, $Si_2ON_2$), of aluminum oxide ($Al_2O_3$), or of hafnium oxide ($HfO_2$). The maximum thickness of each insulating portion 24 may be in the range from 0.2 µm to 1,000 µm. Preferably, insulating layer 24 is opaque to the radiations emitted by optoelectronic circuits 40. Insulating layer 24 may correspond to white resin, to black resin, or to transparent resin filled, in particular, with titanium oxide particles.

Each conductive pad 34, 36, 42 may be at least partly made of a material selected from the group comprising copper, titanium, nickel, gold, tin aluminum, and alloys of at least two of these compounds.

Conductive layer 26 is capable of giving way to the electromagnetic radiation emitted by optoelectronic circuits 40. The material forming conductive layer 26 may be a transparent conductive material such as indium-tin oxide (or ITO), aluminum or gallium zinc oxide, or graphene. The minimum thickness of electrically-conductive layer 26 on display pixels Pix may be in the range from 0.05 µm to 1,000 µm.

Semiconductor layers 48, 52, 54 are at least partly formed from at least one semiconductor material. The semiconductor material is selected from the group comprising III-V compounds, for example, a III-N compound, II-VI compounds, or group-IV semiconductors or compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Examples of group-IV semiconductor materials are silicon (Si), carbon (C), germanium (Ge), silicon carbide alloys (SiC), silicon-germanium alloys (SiGe), or germanium carbide alloys (GeC).

According to an embodiment, each photoluminescent block 44 comprises particles of at least one photoluminescent material. An example of a photoluminescent material is yttrium aluminum garnet (YAG) activated by the trivalent cerium ion, also called YAG:Ce or YAG:Ce3+. The average size of the particles of conventional photoluminescent materials is generally greater than 5 µm.

According to an embodiment, each photoluminescent block 44 comprises a matrix having nanometer-range monocrystalline particles of a semiconductor material, also called semiconductor nanocrystals or phosphor particles hereafter, dispersed therein. The internal quantum efficiency QYint of a photoluminescent material is equal to the ratio of the number of emitted photons to the number of photons absorbed by the photoluminescent substance. The internal quantum efficiency QYint of the semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum dots.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide (AgInS2), perovskites of PbScX3 type where X is a halogen atom, particularly iodine (I), bromine (Br), or chlorine (Cl), and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

The matrix is made of an at least partly transparent material. The matrix is for example made of silica. The matrix is for example made of any at least partly transparent polymer, particularly of silicone or of polylactic acid (PLA). The matrix may be made of an at least partly transparent polymer used with three-dimensional printers, such as PLA. According to an embodiment, the array contains from 2% to 90%, preferably from 10 wt. % to 60 wt. %, of nanocrystals, for example, approximately 30 wt. % of nanocrystals.

The thickness of photoluminescent blocks 44 depends on the nanocrystal concentration and on the type of nanocrystals used. The height of photoluminescent blocks 44 is preferably smaller than or equal to the height of walls 46. In the view of FIG. 2, the area of each photoluminescent block 44 corresponds to the area of a square having a side length measuring from 1 µm to 100 µm, preferably from 3 µm to 15 µm.

Walls 46 are at least partly made of at least one semiconductor or conductor material. The semiconductor or metal conductor material may be silicon, germanium, silicon carbide, a III-V compound, a II-VI compound, steel, iron, copper, aluminum, tungsten, titanium, hafnium, zirconium, or a combination of at least two of these compounds. Preferably, walls 46 are made of a semiconductor material compatible with manufacturing methods implemented in microelectronics. Walls 46 may be heavily-doped, lightly-doped, or non-doped. Preferably, walls 30 are made of single-crystal silicon.

The height of walls 46, measured along a direction perpendicular to surface 14, is in the range from 300 nm to 200 µm, preferably from 5 µm to 30 µm. The thickness of walls 46, measured along a direction parallel to surface 14, is in the range from 100 nm to 50 µm, preferably from 0.5 µm to 10 µm.

According to an embodiment, walls 46 may be made of a reflective material or covered with a coating reflective at the wavelength of the radiation emitted by photoluminescent blocks 44 and/or light-emitting diodes LED.

Preferably, walls 46 surround photoluminescent blocks 44. Walls 46 then decrease the crosstalk between adjacent photoluminescent blocks 44.

The encapsulation layer may be made of an at least partially transparent insulating material. The encapsulation layer may be made of an at least partially transparent inorganic material. As an example, the inorganic material is selected from the group comprising silicon oxides of SiOx type, where x is a real number between 1 and 2 or SiOyNz, where y and z are real numbers between 0 and 1, and aluminum oxides, for example, Al2O3. The encapsulation layer may be made of an at least partially transparent organic material. As an example, the encapsulation layer is a silicone polymer, an epoxide polymer, an acrylic polymer, or a polycarbonate.

According to an embodiment, a metal gate may be formed above transparent conductive layer 26 and in contact with transparent conductive layer 26, the display pixels Pix being located at the level of openings of the metal gate. This enables to improve the electric conduction without hindering the radiation emitted by display pixels Pix.

According to an embodiment, a metal gate may be formed along and in contact with transparent conductive layer 26, to advantageously favor the conduction of the electric current without blocking light rays.

According to an embodiment, in operation, a voltage VE is applied between electrode layers 26 and 18 for the supply of display pixels Pix, particularly of the light-emitting diodes of optoelectronic circuits 40 of display pixels Pix.

Figure 3:
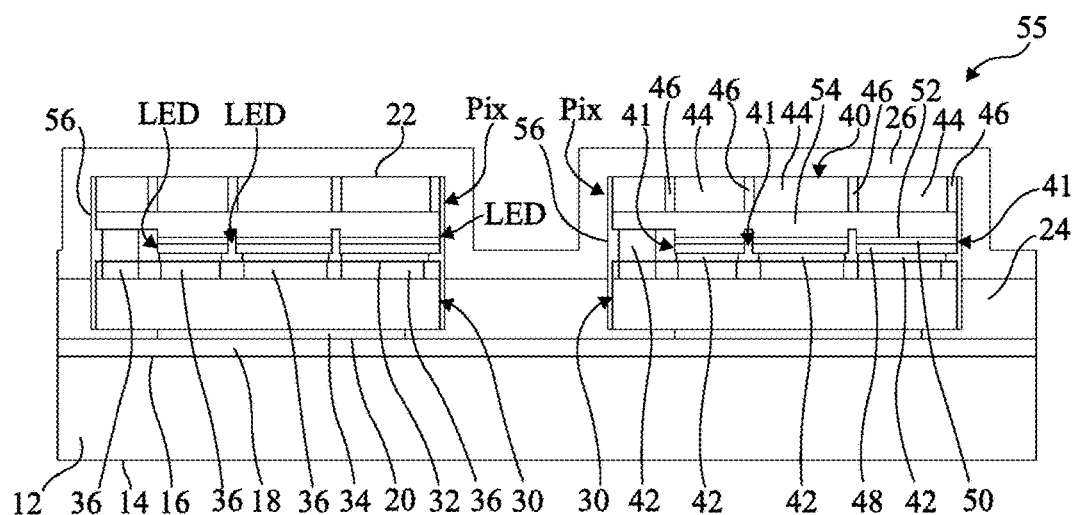
FIG. 3 is a cross-section view of another embodiment of an optoelectronic device.

FIG. 3 is a view similar to FIG. 1 of another embodiment of an optoelectronic device 55 comprising all the elements of optoelectronic device 10, and wherein each display pixel Pix further comprises an electrically-insulating layer 56 covering the sides of display pixel Pix. The minimum thickness of insulating layer 56 may be in the range from 2 nm to 1 mm. Electrode layer 26, in addition to covering the upper surface 22 of each display pixel Pix, may cover a portion of insulating layer 56 of display pixel Pix. Insulating layers 56 may be made of silicon oxide (SiO2), of silicon nitride (SixNy, where x is approximately equal to 3 and y is approximately equal to 4, for example, Si3N4), of silicon oxynitride (SiOxNy, where x may be approximately equal to ½ and y may be approximately equal to 1, for example, Si2ON2), of aluminum oxide (Al2O3), of hafnium oxide (HfO2), or of zirconium oxide (ZrO2).

Figures 4A, 4B, 4C:
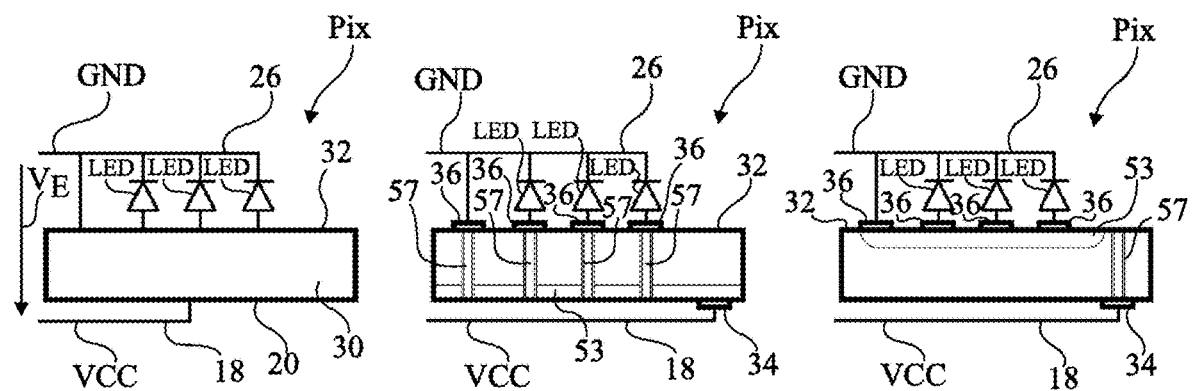
FIG. 4A is an equivalent electric diagram of a display pixel of the optoelectronic device shown in FIGS. 1 and 3.
FIGS. 4B and 4C are electric diagrams similar to FIG. 4A including embodiments of the optoelectronic device control circuit.

FIG. 4A shows an equivalent electric diagram of the display pixel Pix shown in FIGS. 1 and 3. A first electrode, for example, the cathode of each light-emitting diode LED, is connected to control circuit 30 of display pixel Pix while the second electrode of each light-emitting diode LED, for example, the anode, is connected to electrode layer 26, itself coupled to a source of a low reference potential GND, for example, the ground. Control circuit 30 is connected to electrode layer 18, which is coupled to a source of a high reference potential VCC. Display pixel Pix is connected between electrode layers 18 and 26 and receives voltage VE. Circuit 30 controls the light-emitting diodes, LED, of optoelectronic circuit 40.

FIG. 4B is a drawing similar to FIG. 4A where control circuit 30 is shown with an active region 53 arranged on the side of lower surface 20. Active region 53 is the region of control circuit 30 having the electronic components of control circuit 30 formed inside and on top of it. Control circuit 30 further comprises vias 57 extending through control circuit 30, laterally insulated from the rest of the control circuit and electrically coupling conductive tracks formed on the side of lower surface 20 of control circuit 30 to conductive pads 36 located on the side of upper surface 32 of control circuit 30. In particular, one of vias 57 enables to bring the potential supplied by the source of low reference potential GND all the way to active region 53.

FIG. 4C is a drawing similar to FIG. 4A where control circuit 30 is shown with active region 53 arranged on the side of upper surface 32. Control circuit 30 further comprises at least one via 57 extending through control circuit 30 and electrically coupling the conductive pad 34 located on the side of lower surface 20 of control circuit 30 to the conductive pad 36 located on the side of upper surface 32 of control circuit 30. Via 57 enables to take the potential of the source of high reference potential VCC to active region 53.

In the present embodiment, conductive layer 18 is in contact with all the display pixels Pix of optoelectronic circuit 10, 55, and conductive layer 26 is in contact with all the display pixels Pix of optoelectronic device 10, 55.

An embodiment of a method of manufacturing optoelectronic device 10 or 55 comprises manufacturing display pixels Pix and separately installing each display pixel Pix on electrode layer 18. According to an embodiment, electrode layers 18 and 26 being common to all display pixels Pix, the connection of display pixels Pix is simplified and it is not necessary for the placing of each display pixel Pix on electrode layer 18 to be performed with a high accuracy. This advantageously enables to implement faster techniques at decreased costs to arrange display pixels Pix on electrode layer 18. Further, since the light-emitting diodes of each display pixel are integrated to the optoelectronic circuit 40 of display pixel Pix, the number of transfers to be performed during the assembly of optoelectronic device 10 or 55 is decreased. In the present embodiment, each display pixel Pix may comprise a memory having an identifier of the pixel stored therein. The manufacturing method may comprise a calibration phase where the position of each display pixel Pix is recovered according to its identifier. In operation, data may then be transmitted to the pixels according to their identifier.

Figure 5:
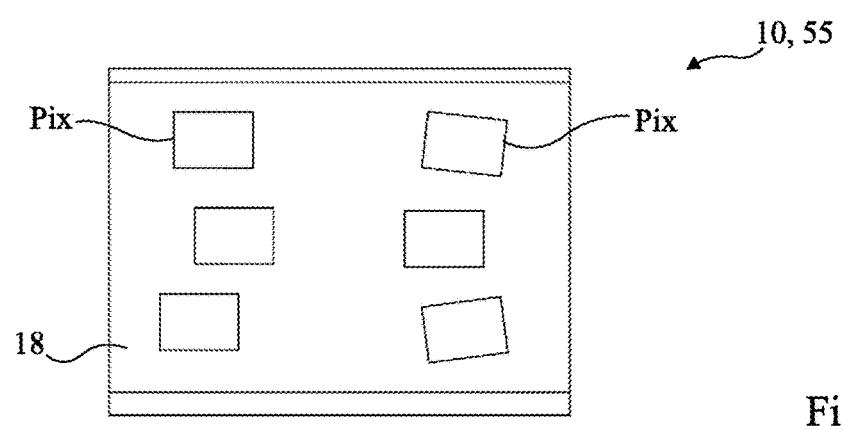
FIG. 5 is a partial simplified top view of the optoelectronic device shown in FIGS. 1 and 3 illustrating an advantage of the optoelectronic device manufacturing method.

FIG. 5 shows a simplified top view of optoelectronic device 10 or 55 illustrating the fact that it is possible for display pixels Pix not to be very accurately arranged, for example, perfectly aligned in rows and in columns, and that certain display pixels Pix may be inclined with respect to the directions of the rows and of the columns.

In the previously-described embodiments, electrode layer 18 is connected to all the display pixels Pix and appears in the form of an uninterrupted layer extending over most of or even all of support 12.

For each display pixel Pix, control circuit 30 is capable of receiving control signals and of controlling, based on the received control signals, the light-emitting diodes of the display pixel, particularly the shade, the saturation, and the brightness of the light emitted by the display pixel.

According to an embodiment, the control signals may be transmitted to the control circuits 30 of display pixels Pix by a modulation of voltage VE.

Figure 6:
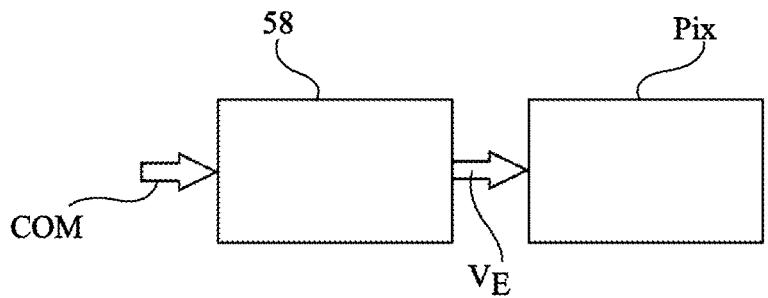
FIG. 6 is a diagram illustrating the control of the optoelectronic device shown in FIG. 1 or 3.

FIG. 6 very schematically shows a processing unit 58 receiving control signals COM and capable of supplying optoelectronic device 10 and 55 with a voltage VE for powering display pixels Pix, which is modulated with control signals COM. Processing unit 58 may correspond to a dedicated circuit or may comprise a processor, for example, a microprocessor or a microcontroller, capable of executing instructions of a computer program stored in the memory.

The control circuit 30 of each display pixel Pix may extract control signals COM by demodulation of voltage VE. Control circuit 30 can then determine whether control signals COM are addressed thereto. As an example, an identifier may be associated with each display pixel Pix and the control signals COM obtained by demodulation of voltage VE may comprise the identifier of the display pixel for which the control signals are intended.

Advantageously, an active addressing of display pixels Pix may be performed. Indeed, each control circuit 30 may control the maintaining of the display properties, particularly the shade, the saturation, and the brightness, of the display pixel until it receives new control signals.

Figure 7:
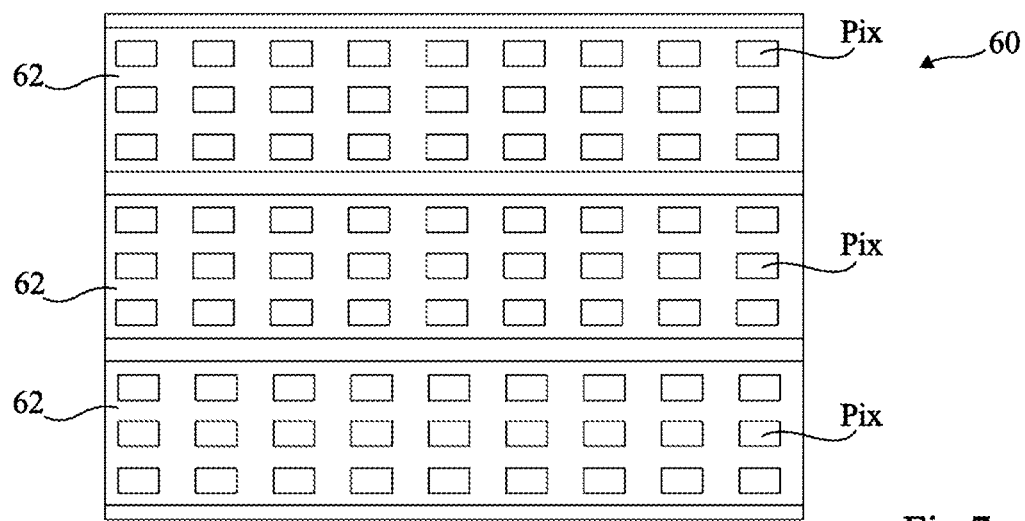
FIGS. 7 to 11 are partial simplified top views of other embodiments of an optoelectronic device.

FIG. 7 shows a simplified top view of another embodiment of an optoelectronic device 60 comprising all the elements of optoelectronic 10 or 55 where electrode layer 18 is divided into parallel electrically-conductive strips 62 extending on support 12, three strips being shown as an example in FIG. 7. At least one row of display pixels Pix is distributed on each conductive strip 62. Preferably, a plurality of rows of display pixels Pix are distributed on each conductive strip 62, three rows of display pixels Pix being represented by a conductive strip 62 as an example in FIG. 7.

According to another embodiment, electrode layer 18 and/or electrode layer 26 may be divided into distinct electrode strips. According to another embodiment, electrode layer 26 may also be divided into parallel electrically-conductive strips. When electrode layers 18 and 26 are each divided into strips, the strips of electrode layer 18 preferably have substantially the same dimensions as the strips of electrode layer 26 and each strip of electrode layer 26 substantially covers a single one of the strips of electrode layer 18. According to another embodiment, one of electrodes 18 or 26 may be common to display pixels Pix while the other electrode 18 or 26 is divided into parallel electrically-conductive strips. In the embodiment where electrode layers 18, 26 are divided into stacked strips sandwiching assemblies of display pixels, different control signals may be transmitted in parallel by modulating voltage VE differently for each assembly of display pixels. This enables to transmit in parallel the control signals for each assembly of display pixels Pix. This enables to decrease the modulation frequency of the electromagnetic radiation and/or to increase the rate of transmitted data.

Figure 8:
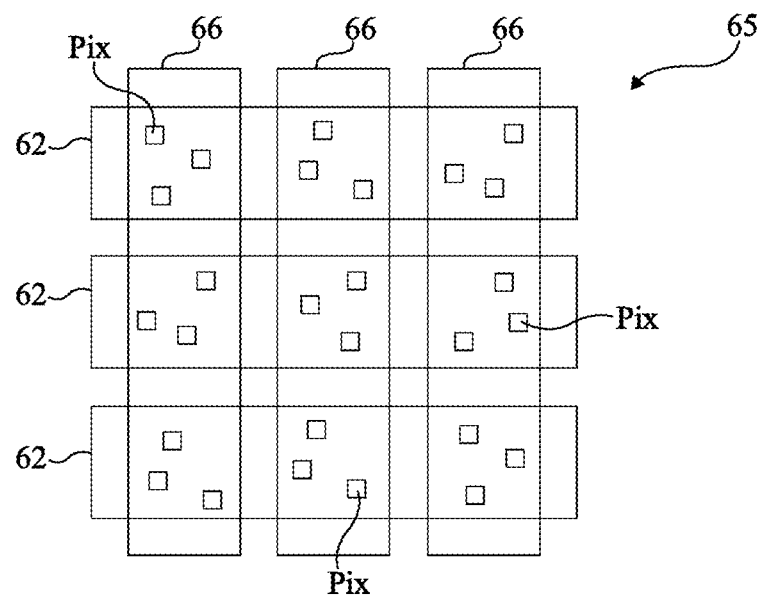

FIG. 8 is a partial simplified top view of another embodiment of an optoelectronic device 65 where electrode layer 18 is divided into conductive strips 62 extending along the row direction and where electrode layer 26 is divided into electrically-conductive strips 66 extending along the column direction, and called columns electrodes. At least one display pixel Pix is arranged at the intersection, in top view, between each row electrode 62 and each column electrode 66 and is connected to row electrode 62 and to column electrode 66. As an example, in FIG. 8, three display pixels Pix are provided at the intersection, in top view, between each row electrode 62 and each column electrode 66. According to an embodiment, the display pixels Pix at the intersection of each row electrode 62 and of each column electrode 66 may form a pixel of the image to be displayed. This enables to have a redundancy in the case where one of the display pixels Pix is defective. It should be noted that, for each display pixel Pix, the entire lower surface of the display pixel Pix is not necessarily in contact with one of row electrodes 62 and/or the entire upper surface of display pixel Pix is not necessarily in contact with one of column electrodes 66. This means that the display pixel Pix may be astride one of the row electrodes 62 and the adjacent region between strips and/or that display pixel Pix may be astride one of column electrodes 66 and the adjacent region between strips.

According to another embodiment, transparent strips 66, for which the deposition over great lengths/continuous surfaces may be complicated, may be formed of discontinuous areas, where the display pixels are connected, such discontinuous areas being connected to one another by metal tracks. This advantageously enables to ease the forming of the upper electrodes and to improve the electric conductivity.

Figure 9:
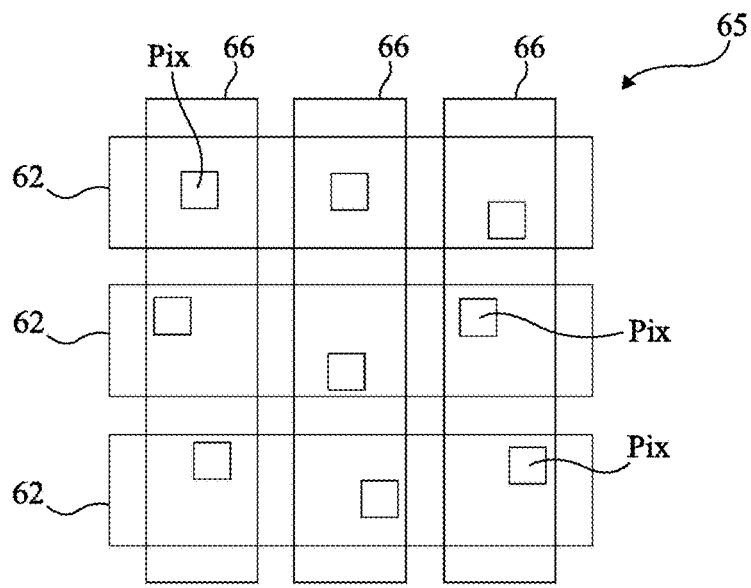

FIG. 9 is a partial simplified top view of an embodiment of optoelectronic device 65 having a single display pixel Pix provided at the intersection of each row electrode 62 and of each column electrode 66.

As shown in FIG. 9, the width of each conductive strip 66 is preferably greater than the dimension of display pixel Pix measured along the column direction and the width of each conductive strip 62 is greater than the dimension of display pixel Pix measured along the row direction, particularly to avoid a short-circuit. Thereby, for each row, it is possible for the display pixels Pix belonging to the row not to be perfectly aligned. Similarly, for each column, it is possible for the display pixels Pix belonging to the column not to be perfectly aligned.

Figure 10:
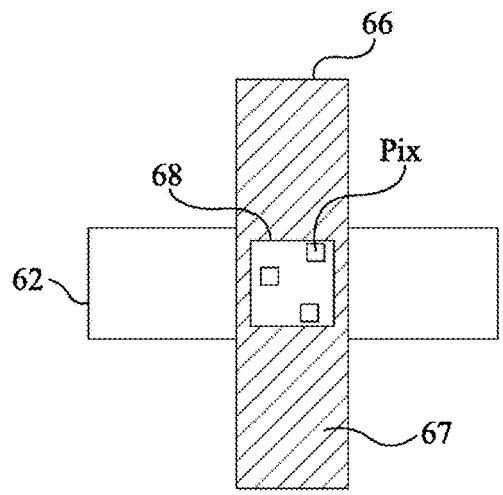

FIG. 10 is a partial simplified top view of a variation of optoelectronic device 65 where a metal gate 67 is formed above each upper transparent conductive strip 66 and in contact with transparent conductive strip 66, the display pixels Pix being located at the level of openings 68 of metal gate 67. This enables to improve the electric conduction without hindering the radiation emitted by display pixels Pix.

Figure 11:
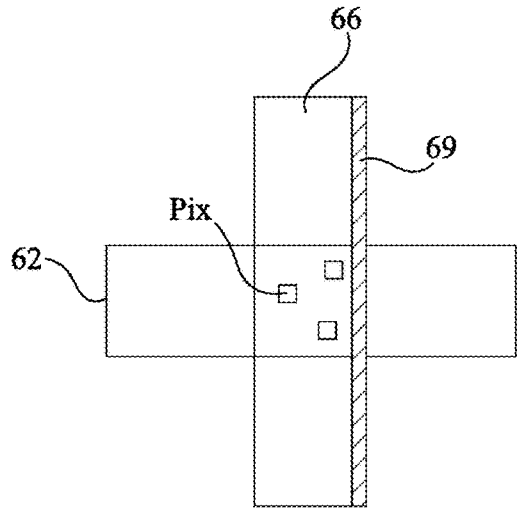

FIG. 11 is a partial simplified top view of another variation of optoelectronic device 65 where a metal gate 69 is formed along and in contact with each transparent conductive strip 66, to advantageously favor the conduction of the electric current without blocking light rays.

FIGS. 12A to 12L are partial simplified cross-section views of structures obtained at successive steps of another embodiment of a method of manufacturing the optoelectronic device 10 shown in FIG. 1.

Figure 12A:
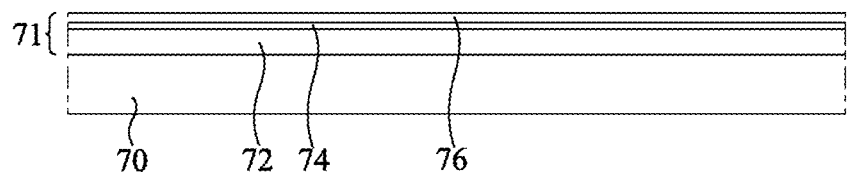
FIGS. 12A to 12L are partial simplified lateral cross-section views of structures obtained at successive steps of another embodiment of a method of manufacturing the optoelectronic device shown in FIG. 1.

FIG. 12A shows the structure obtained after the forming on a support 70 of a stack 71 of semiconductor layers, comprising, from bottom to top in FIG. 12A, a semiconductor layer 72, an active layer 74, and a semiconductor layer 76. Semiconductor layer 72 may have the same composition as the previously-described semiconductor layers 52, 54. Active layer 74 may have the same composition as the previously-described active layer 50. Semiconductor layer 76 may have the same composition as the previously-described semiconductor layer 48. A seed layer may be provided between support 70 and semiconductor layer 72. Preferably, there is no seed layer between support 70 and semiconductor layer 72.

Figure 12B:
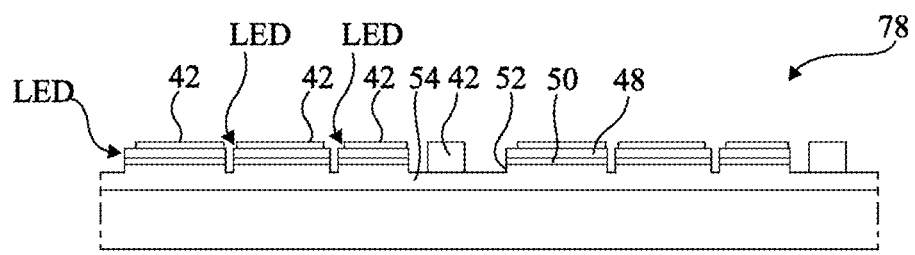

FIG. 12B shows the structure obtained after the delimiting of the light-emitting diodes LED of optoelectronic circuits 40 and the forming of conductive pads 42. Light-emitting diodes LED may be delimited by etching semiconductor layer 72, active layer 74, and semiconductor layer 76 to delimit, for each light-emitting diode LED of each optoelectronic circuit 40, semiconductor layer 52, active layer 50, and semiconductor layer 48. The implemented etching may be a dry etching, for example, using a chlorine- and fluorine-based plasma, a reactive ion etching (RIE). The non-etched portion of semiconductor layer 72 forms the previously-described semiconductor layer 54. Conductive pads 42 may be obtained by depositing a conductive layer over the entire obtained structure and by removing a portion of the conductive layer outside of conductive pads 42. An optoelectronic circuit 78 comprising a plurality of copies, not completed yet, of optoelectronic circuit 40, is obtained, two copies being shown in FIG. 12B.

Figure 12C:
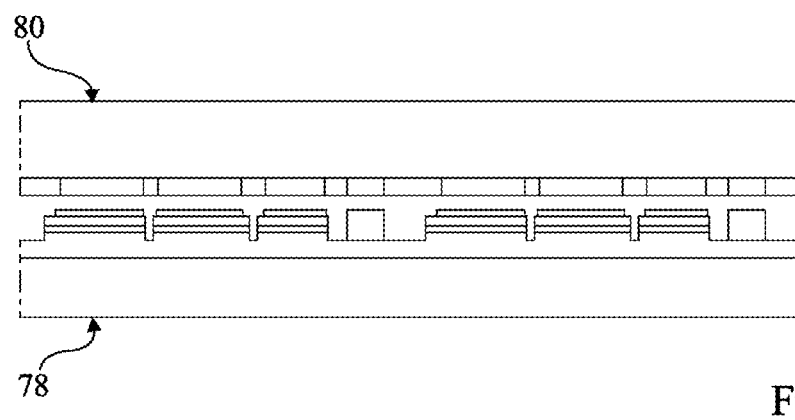

FIG. 12C shows the structure obtained after the manufacturing of an electronic circuit 80 comprising a plurality of copies, not fully completed, of the desired control circuit 30, particularly by conventional steps of an integrated circuit manufacturing method, and just before the bonding of electronic circuit 80 to optoelectronic circuit 78. The methods of assembly of electronic circuit 80 to optoelectronic circuit 78 may comprise soldering or molecular bonding operations.

Figure 12D:
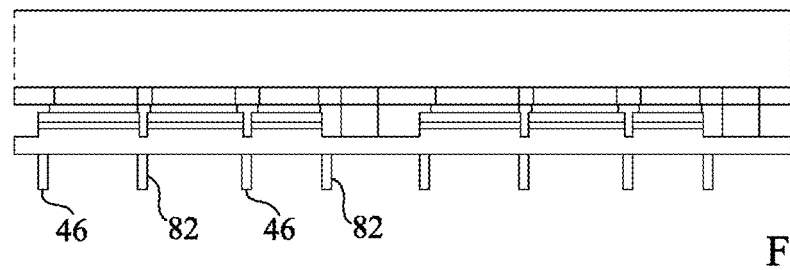

FIG. 12D shows the structure obtained after the forming of walls 46 in support 70. Walls 46 may be formed by etching openings 82 in support 70.

Figure 12E:
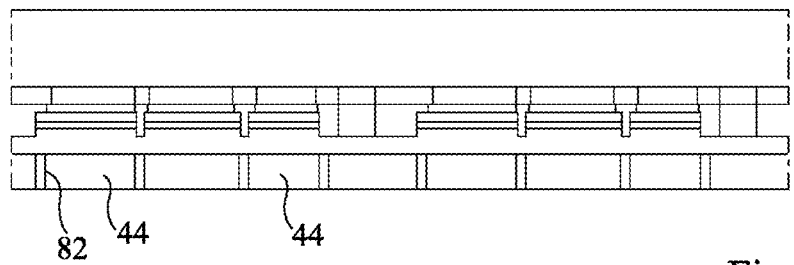

FIG. 12E shows the structure obtained after the forming of photoluminescent blocks 44. Photoluminescent blocks 44 may be formed by filling certain openings 82 with a colloidal dispersion of semiconductor nanocrystals in a bonding array, for example, by a so-called additive method, possibly by filling certain openings 82 with resin. The so-called additive method may comprise the direct printing of the colloidal dispersion at the desired locations, for example, by inkjet printing, aerosol printing, microprinting, photogravure, silk-screening, flexography, spray coating, or drop casting. According to another embodiment, photoluminescent blocks 44 may be formed before the manufacturing of walls 46.

Figure 12F:
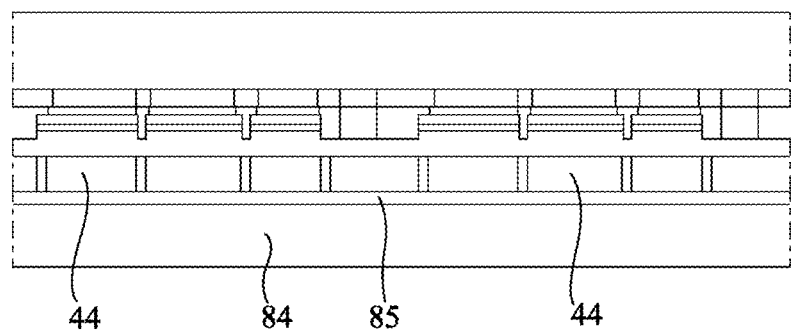

FIG. 12F shows the structure obtained after the bonding of the structure shown in FIG. 12E, on the side of photoluminescent blocks 44, to a support 84, also called handle, by using a bonding material 85.

Figure 12G:
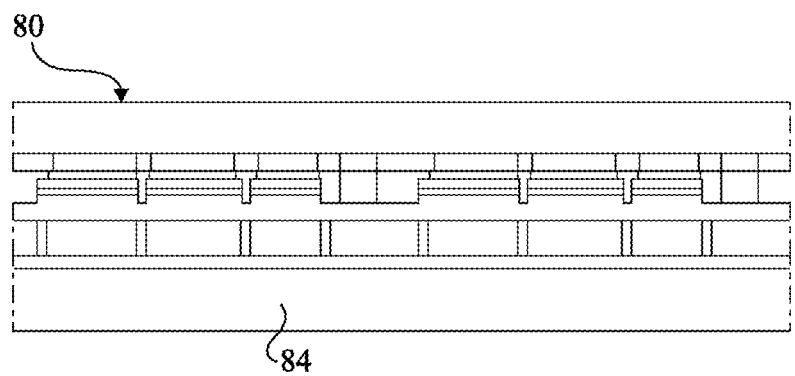

FIG. 12G shows the structure obtained after having thinned the substrate of electronic circuit 80 on the side opposite to handle 84.

Figure 12H:
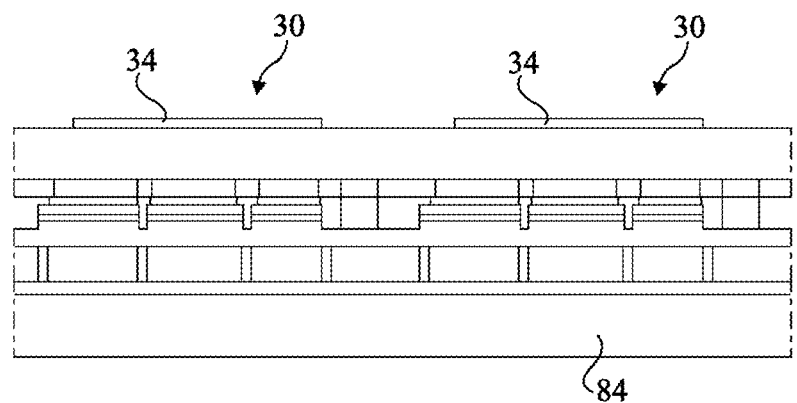

FIG. 12H shows the structure obtained after the forming of conductive pads 34 of control circuits 30 on electronic circuit 80 on the side opposite to handle 84.

Figure 12I:
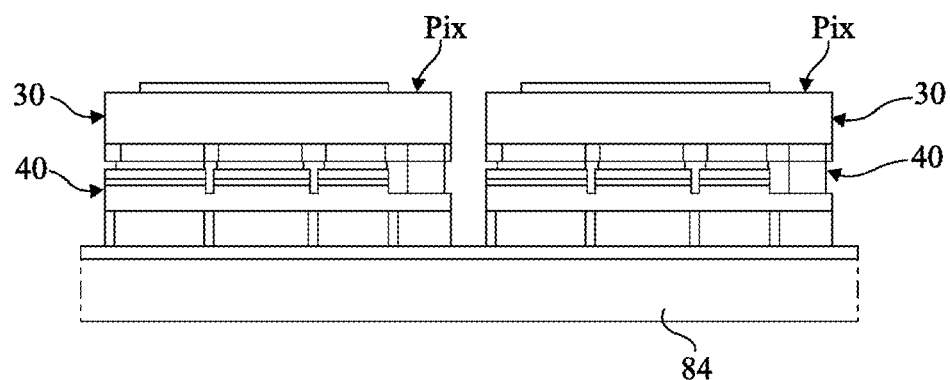

FIG. 12I shows the structure obtained after the separation of control circuits 30 in electronic circuit 80 and of optoelectronic circuits 40 in optoelectronic circuit 78. Display pixels Pix are thus delimited while remaining bonded to handle 84.

Figure 12J:
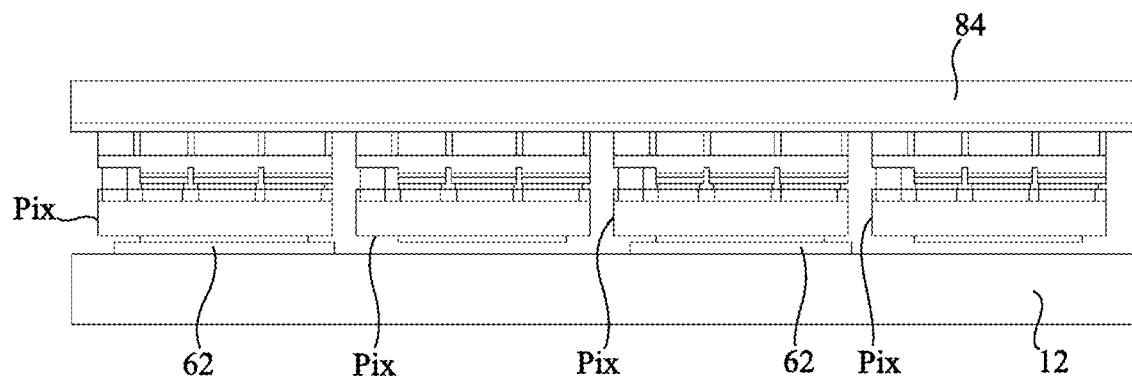

FIG. 12J shows the structure obtained after the bonding of some of display pixels Pix to support 12. In the present embodiment, two conductive strips 62 have been shown in support 12. The display pixels Pix which are in contact with conductive strips 62 bond to conductive strips 62. The display pixels Pix which are not in contact with conductive strips 62 are not bonded to support 12. As an example, each display pixel Pix may be bonded to one of conductive strips 62 by molecular bonding or via a bonding material, particularly electrically-conductive epoxy glue.

Figure 12K:
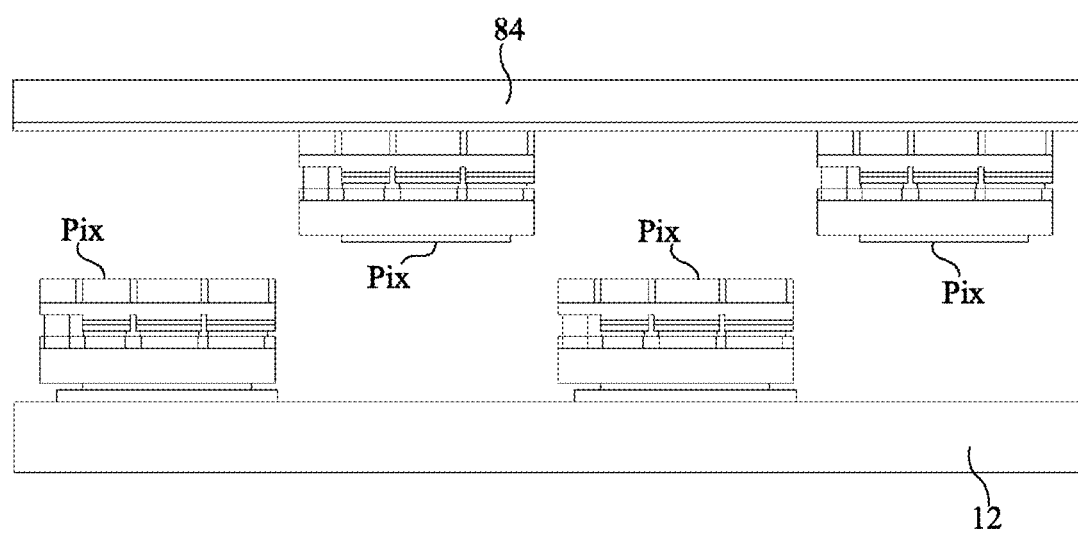

FIG. 12K shows the structure obtained after the separation of handle 84 of the display pixels Pix bonded to support 12. Such a separation may be performed by laser ablation. The embodiment illustrated in FIGS. 12J and 12K enables to simultaneously bond a plurality of display pixels Pix to support 12.

As a variation, after the step illustrated in FIG. 12I, the display pixels Pix may be separated from handle 84 and a "pick and place" method may be implemented, which comprises separately placing each display pixel Pix on support 12.

Figure 12L:
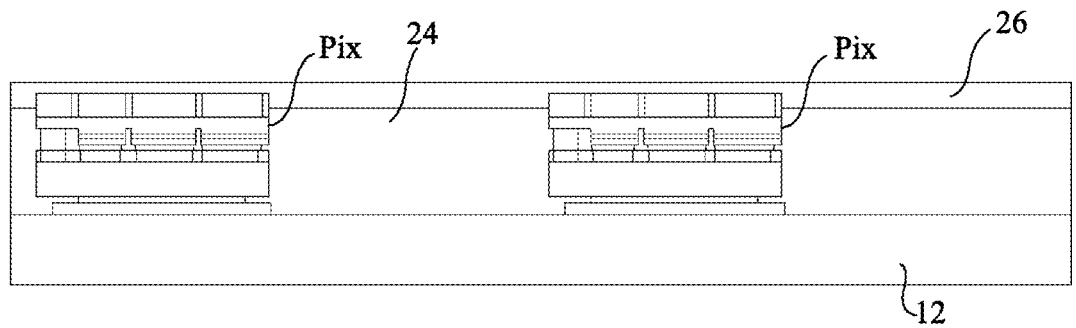

FIG. 12L shows the structure obtained after the forming of insulating layer 24 and of electrode layer 26. Insulating layer 24 may be deposited by chemical vapor deposition (CVD), plasma-enhanced chemical vapor deposition (PECVD), or cathode sputtering. Electrode layer 26 may be deposited by CVD, PECVD, ALD, cathode sputtering, or evaporation.

FIGS. 13A to 13E are partial simplified cross-section views of structures obtained at successive steps of another embodiment of a method of manufacturing the optoelectronic device 55 shown in FIG. 3.

Figure 13A:
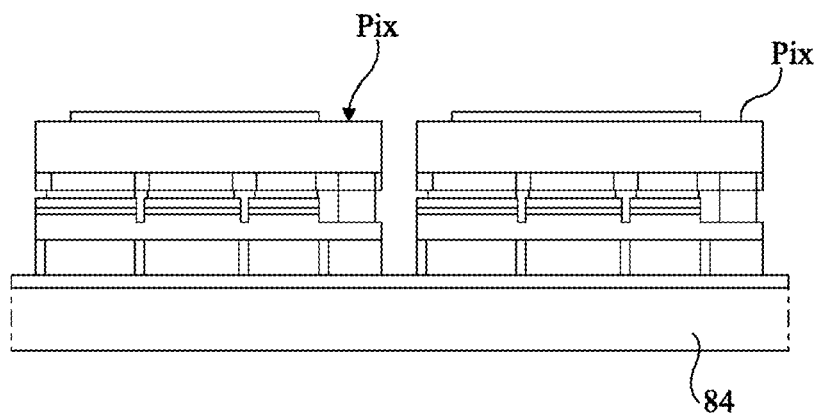
FIGS. 13A to 13E are partial simplified lateral cross-section views of structures obtained at successive steps of another embodiment of a method of manufacturing the optoelectronic device shown in FIG. 3.

FIG. 13A shows the structure obtained after the implementation of the steps previously described in relation with FIGS. 12A to 12I.

Figure 13B:
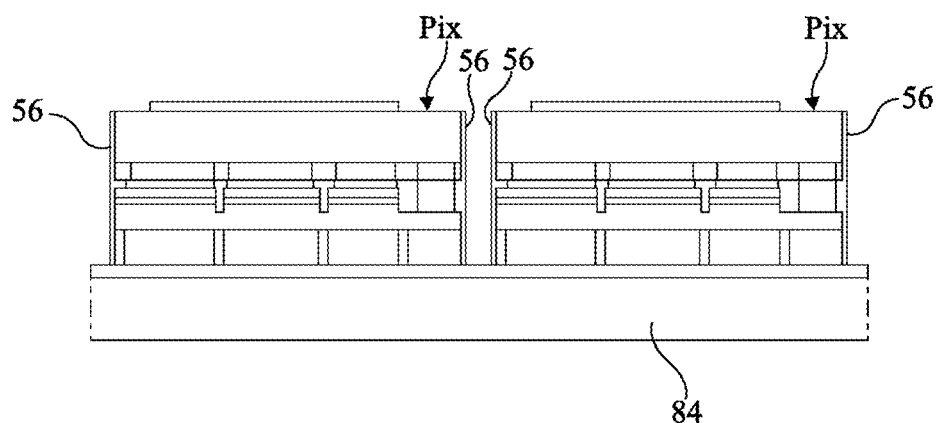

FIG. 13B shows the structure obtained after the forming, for each display pixel Pix, of insulating layer 56 on the sides of display pixel Pix. Insulating layer 56 may be deposited by chemical vapor deposition (CVD), plasma-enhanced chemical vapor deposition (PECV), atomic layer deposition (ALD), or cathode sputtering. It may be a conformal deposition followed by a selective etching.

Figure 13C:
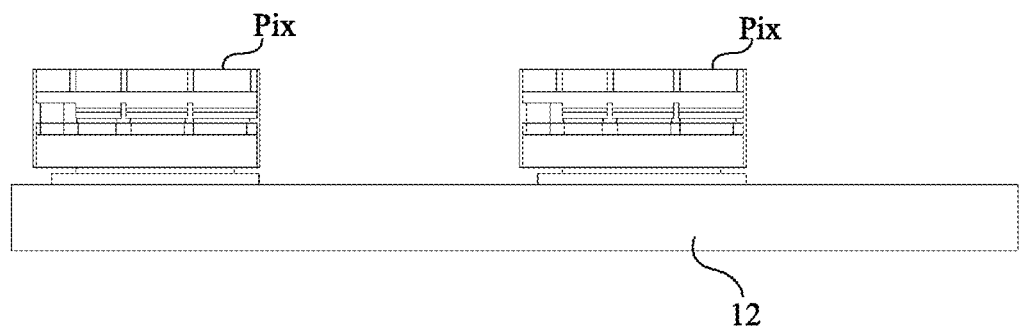

FIG. 13C shows the structure obtained after the bonding of display pixels Pix on support 12, for example, by the implementation of the steps previously described in relation with FIGS. 12J and 12K.

Figure 13D:
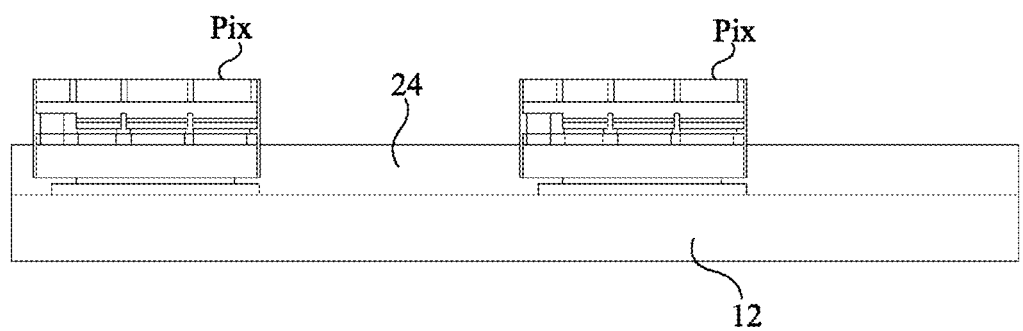

FIG. 13D shows the structure obtained after the forming of insulating layer 24, for example, as previously described in relation with FIG. 12L.

Figure 13E:
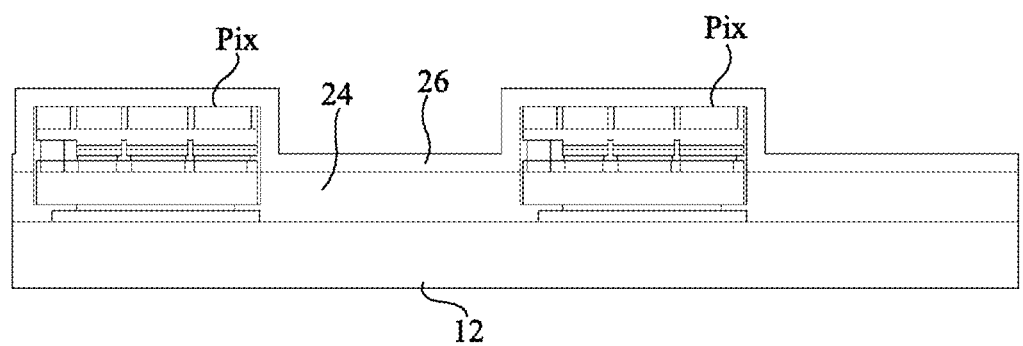

FIG. 13E shows the structure obtained after the forming of second electrode layer 26, for example, as previously described in relation with FIG. 12L. Advantageously, the presence of insulating layer 56 on the sides of each display pixel Pix enables to prevent the forming of an electric contact between electrode layer 26 and a conductive element, which in the absence of insulating layer 56, would be exposed on the sides of display pixel Pix. The thickness of insulating layer 24 then does not need to be accurately defined.

Figure 14:
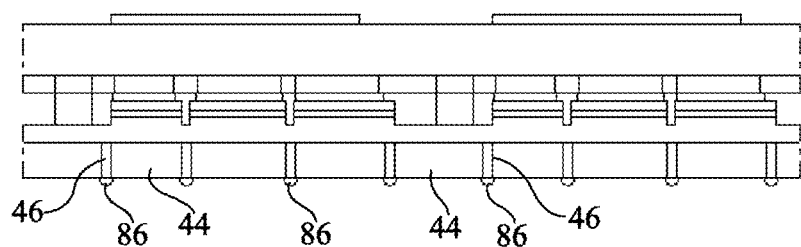
FIG. 14 is a cross-section view of the structure obtained at a step of another embodiment of a method of manufacturing the optoelectronic device shown in FIG. 1 or 3.

FIG. 14 shows the structure obtained for a variation of a method of manufacturing optoelectronic circuit 10, where, after the step previously described in relation with FIG. 12H, handle 84 is removed and electrically-conductive strips 86 are formed at the ends of walls 46 opposite to light-emitting diodes LED. This enables to improve the electric connection between walls 46 and electrode layer 26. Conductive strips 86 are for example at least partly made of aluminum, of silver, of copper, or of zinc. The thickness of conductive strips 86 may be in the range from 50 nm to 2 mm.

Figure 15:
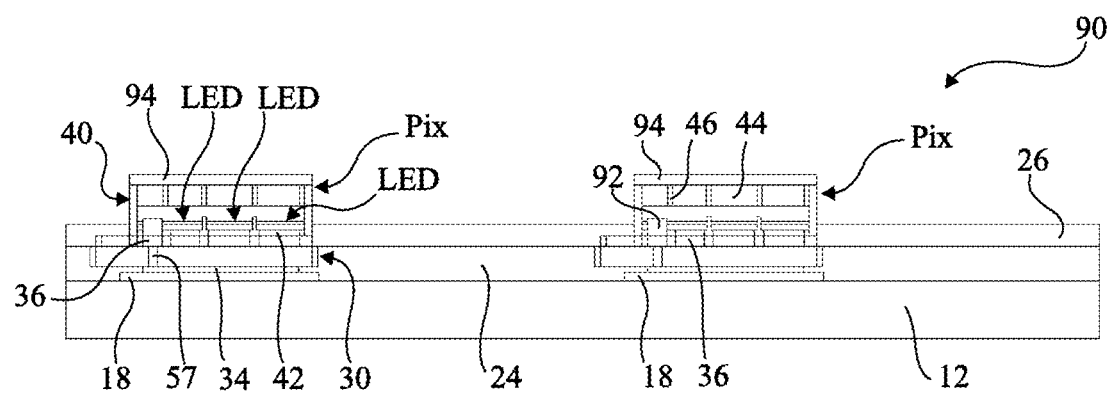
FIG. 15 is a cross-section view of another embodiment of an optoelectronic device.
Figure 16A:
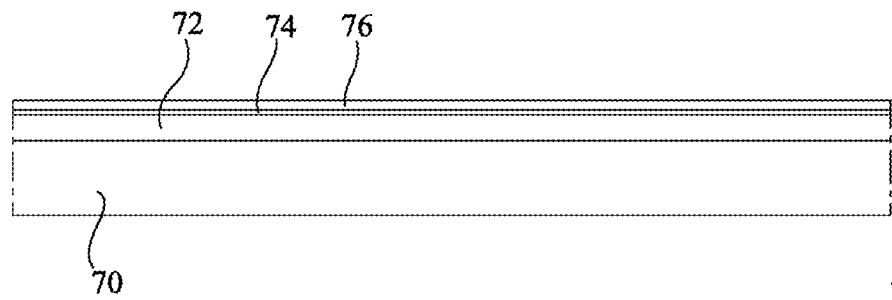
FIGS. 16A to 16K are partial simplified cross-section views of structures obtained at successive steps of another embodiment of a method of manufacturing the optoelectronic device shown in FIG. 15.
Figure 16B:
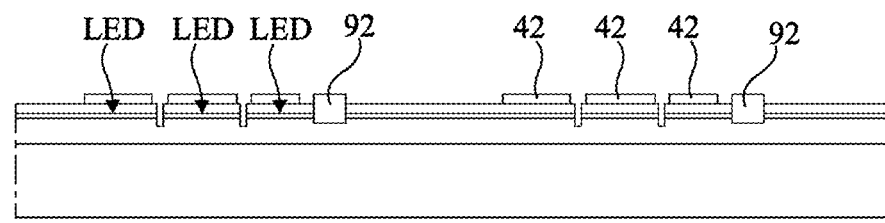
Figure 16C:
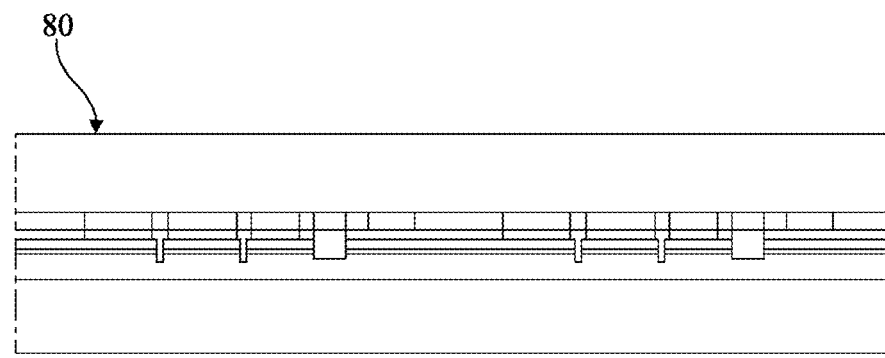
Figure 16D:
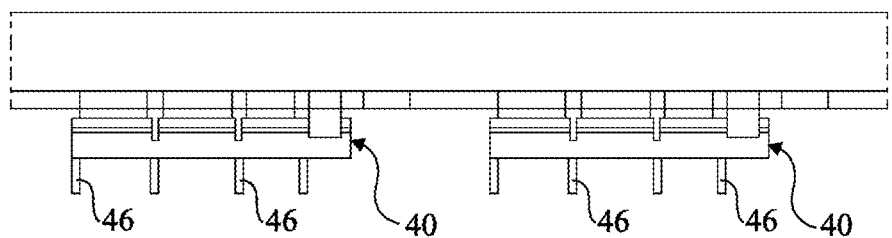
Figure 16E:
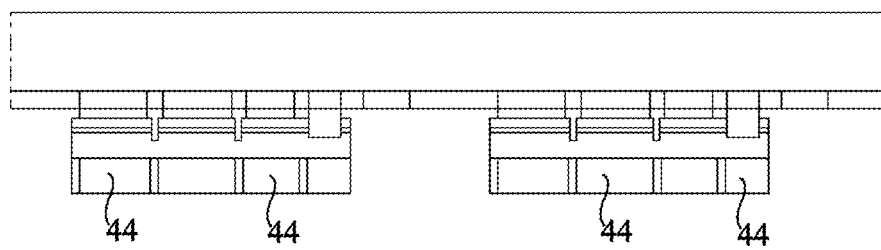
Figure 16F:
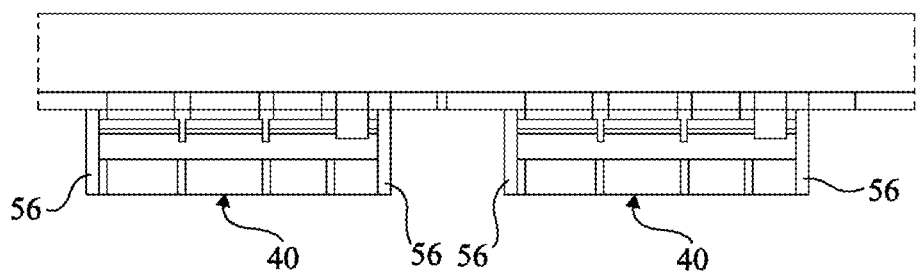
Figure 16G:
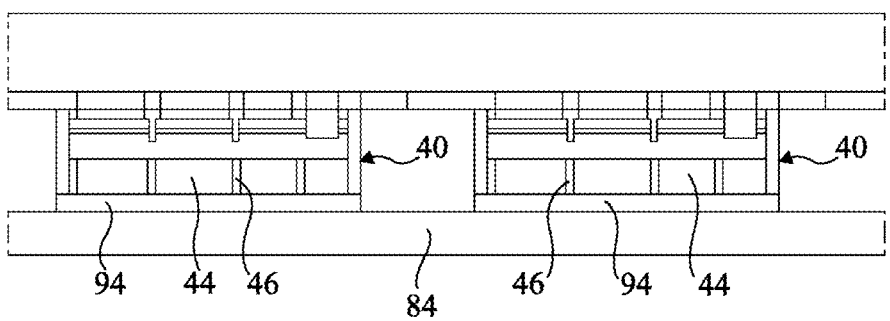
Figure 16H:
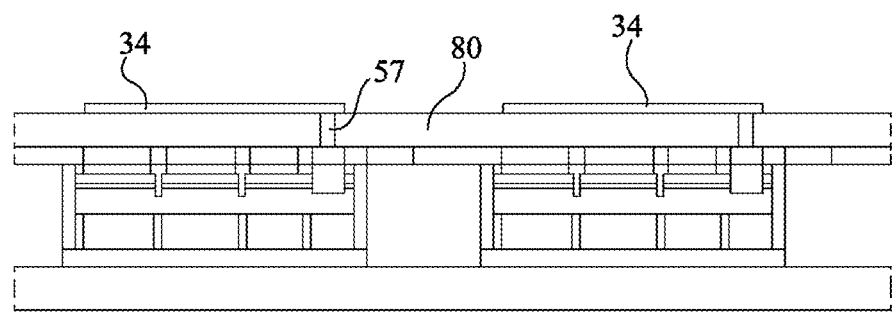
Figure 16I:
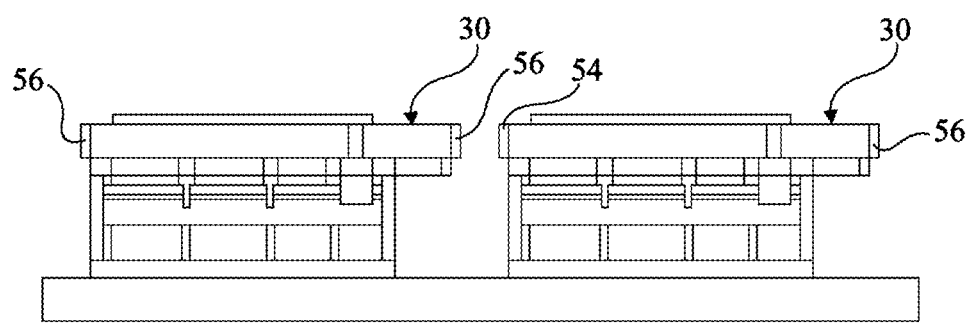
Figure 16J:
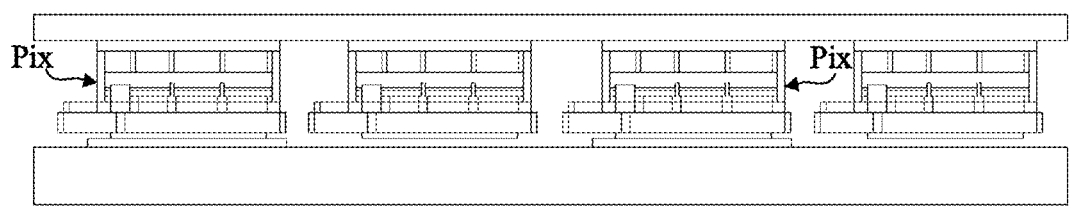
Figure 16K:
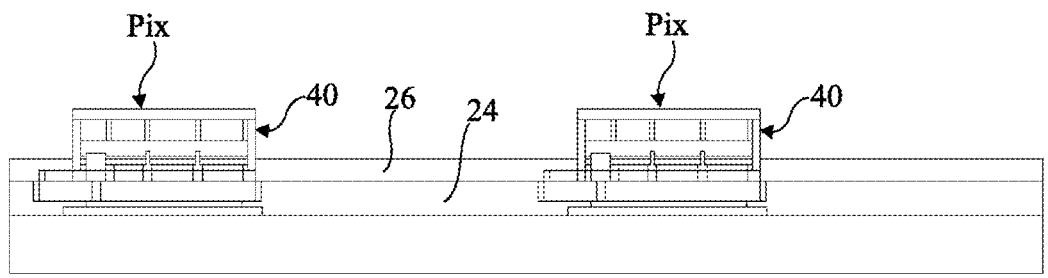

FIG. 15 is a view similar to FIG. 3 of another embodiment of optoelectronic circuit 90 comprising all the elements of optoelectronic circuit 55, with the difference that electrode layer 26 does not cover the display pixels Pix and that the conductive pad 36 connected to semiconductor layer 54 is replaced with a connection element 92 forming a laterally-insulated via crossing semiconductor layer 48 and active layer 50 and stopping in semiconductor layer 54 and which extends, outside of semiconductor layer 48, in a conductive pad. Further, each display pixel Pix comprises an insulating layer 94 covering photoluminescent blocks 44 and the ends of walls 46 opposite to semiconductor layer 54, one of the conductive pads 36 of control circuit 30 being in contact with the second electrode layer 26 and control circuit 30 comprising a via 57 coupling conductive pad 34 to one of conductive pads 36.

The present embodiment enables to couple the second electrode layer 26 to the source of high reference potential VDD and electrode layer 18 to the low reference potential source while using a control circuit 30 having its active area located on the side of upper surface 32 of control circuit 30. Indeed, low reference potential GND is taken to the cathode of light-emitting diodes LED via through via 57, which couples conductive pad 34 to the conductive pad 36 connected to connection element 92, and high reference potential VCC is taken to the active region of control circuit 30 by the conductive pad 36 connected to electrode layer 26.

FIGS. 16A to 16K are partial simplified cross-section views of structures obtained at successive steps of another embodiment of a method of manufacturing the optoelectronic device 90 shown in FIG. 15.

The present embodiment of the manufacturing method comprises the steps of:
- forming semiconductor layers 72, 74, 76 on support 70 (FIG. 16A) as previously described in relation with FIG. 12A;
- forming light-emitting diodes LED and conductive pads 42 (FIG. 16B) as previously described in relation with FIG. 12B and forming connection element 92;
- bonding electronic circuit 80 (FIG. 16C) as previously described in relation with FIG. 12C;
- forming walls 46 (FIG. 16D) as previously described in relation with FIG. 12D and separating optoelectronic circuits 40;
- forming photoluminescent blocks 44 (FIG. 16E) as previously described in relation with FIG. 12E;
- forming insulating layer 56 on the lateral walls of each optoelectronic circuit 40 (FIG. 16F) as previously described in relation with FIG. 13B;
- forming insulating layer 94 covering, for each optoelectronic circuit 40, photoluminescent blocks 44 and walls 46, and bonding a handle 84 (FIG. 16G) as previously described in relation with FIG. 12F;
- thinning the substrate of electronic circuit 80, forming via 57, and forming conductive pads 34 (FIG. 16H) as previously described in relation with FIGS. 12G and 12H;
- separating electronic circuits 30 (FIG. 16I) and forming insulating layers 56 on the lateral walls of electronic circuits 30 as previously described in relation with FIG. 13B;

bonding some of display pixels Pix to support 12 (FIG. 16J) as previously described in relation with FIG. 12J; and forming insulating layer 24 and electrode layer 26 (FIG. 16K) similarly to what has been previously described in relation with FIG. 12L, with the difference that electrode layer 26 does not cover the optoelectronic circuits 40 of display pixels Pix.

Figure 17:
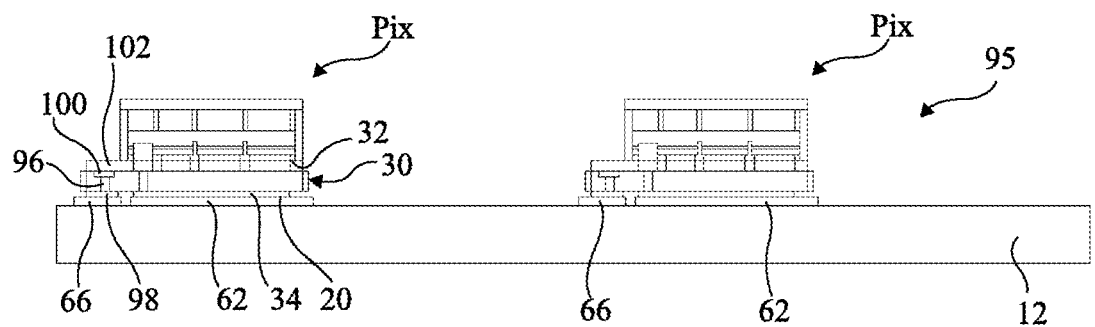
FIGS. 17 and 18A respectively are a cross-section view and a top view, partial and simplified, of another embodiment of an optoelectronic device.
Figures 18A, 18B:
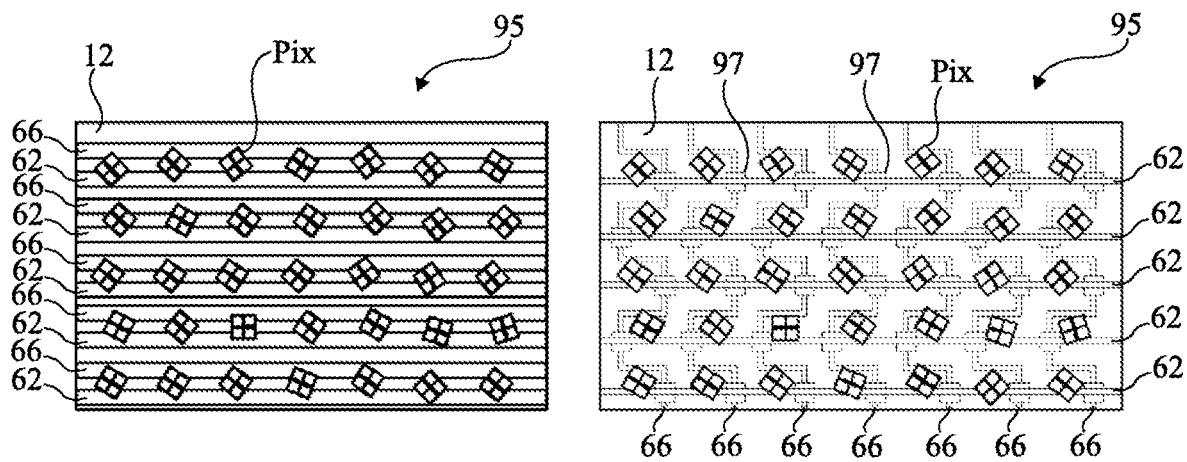
FIG. 18B is a variation of FIG. 18A.
Figure 19A:
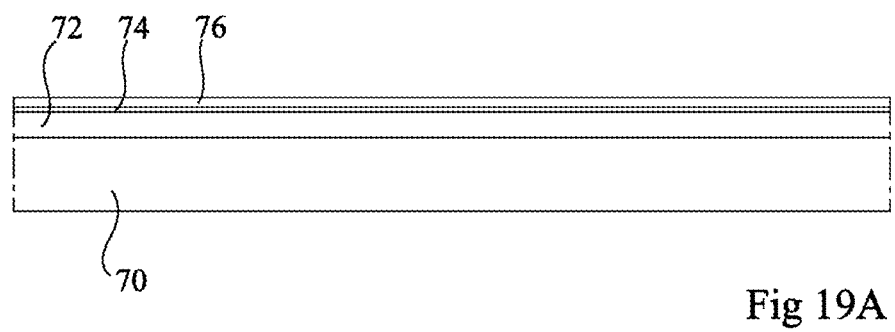
FIGS. 19A to 19J are partial simplified lateral cross-section views of structures obtained at successive steps of another embodiment of a method of manufacturing the optoelectronic device shown in FIGS. 17 and 18.
Figure 19B:
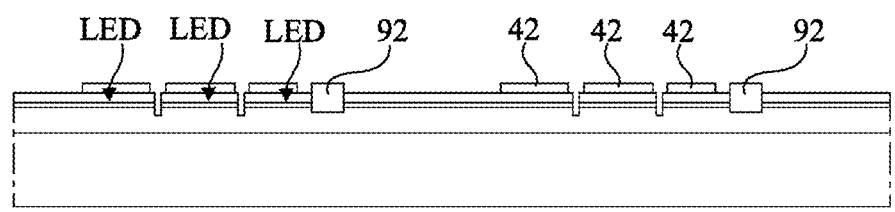
Figure 19C:
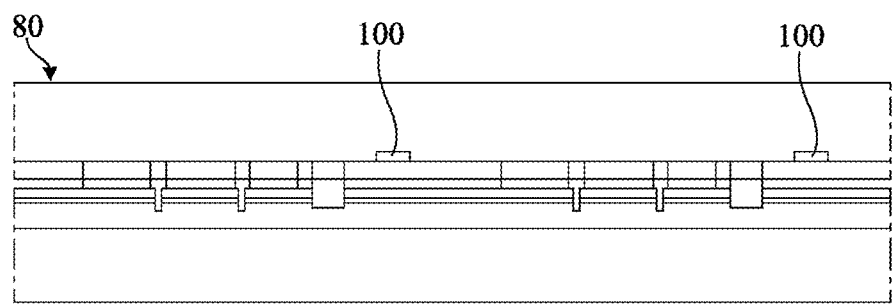
Figure 19D:
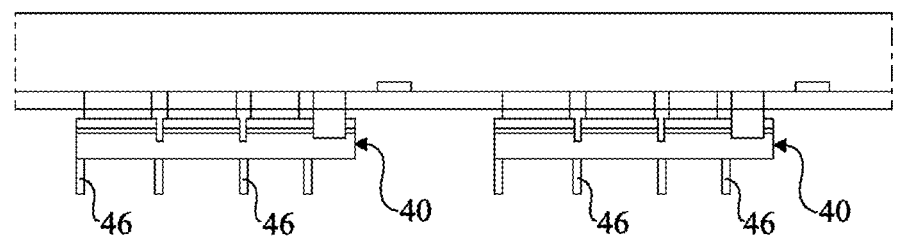
Figure 19E:
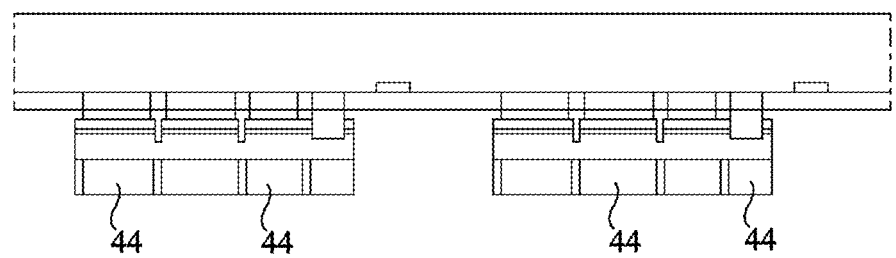
Figure 19F:
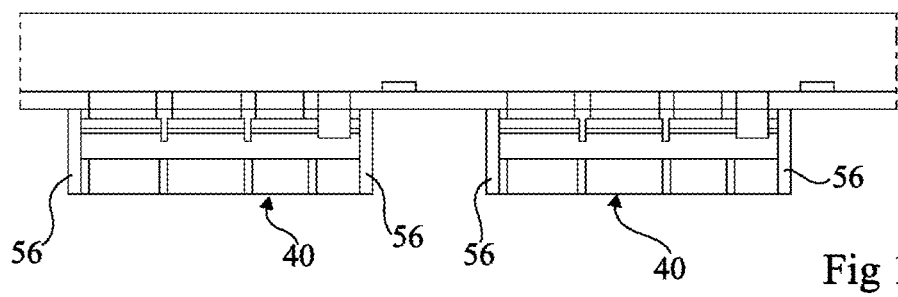
Figure 19G:
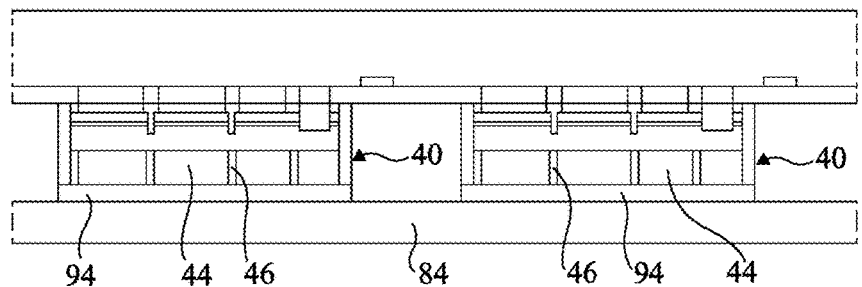
Figure 19H:
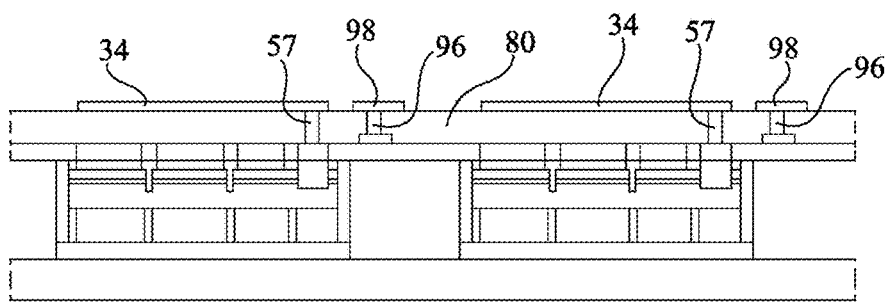
Figure 19I:
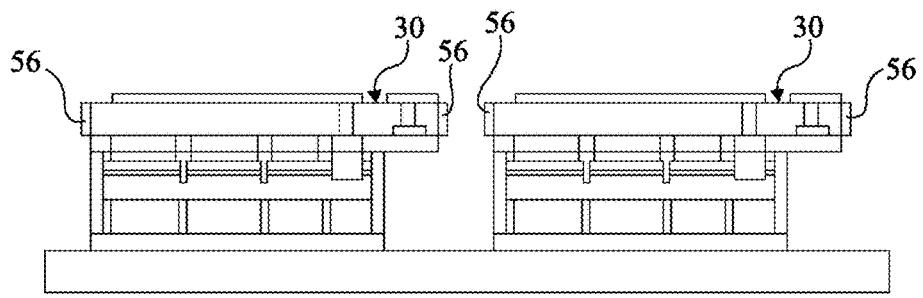
Figure 19J:
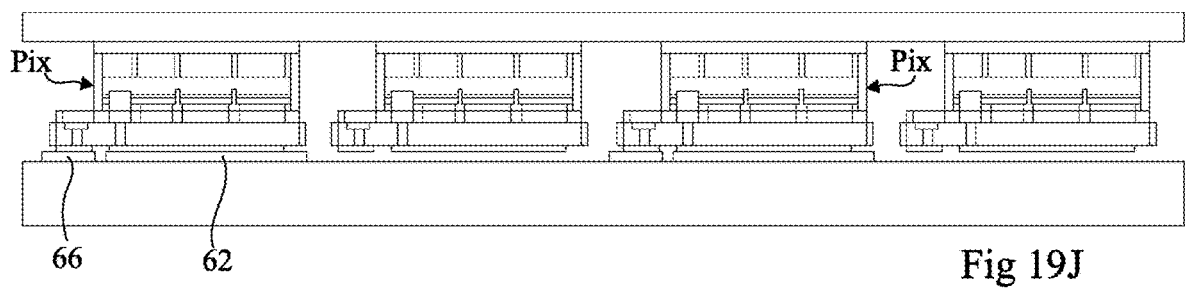

FIGS. 17 and 18A respectively are a cross-section view and a top view, similar to FIGS. 1 and 2, of another embodiment of an optoelectronic circuit 95. Device 95 comprises all the elements of optoelectronic circuit 90, with the difference that conductive strips 66 are arranged on substrate 12 like conductive strips 62, conductive strips 62 and 66 being for example parallel. Insulating layer 24 may then not be present. For each display pixel Pix, the control circuit 30 of display pixel 30 comprises a through via 96 extending through control circuit 30, laterally insulated from the rest of the control circuit and electrically coupling a conductive track 98 formed on the side of lower surface 20 of control circuit 30 to a conductive area 100 located on the side of upper surface 32 of control circuit 30 and covered with an insulating layer 102. Via 96 enables to take the potential supplied by the source of high reference potential VCC to the upper surface 32 of control circuit 30.

FIG. 18B is a variation of FIG. 18A where conductive strips 62 are arranged along the rows of display pixels Pix and conductive strips 66 are arranged along the rows of display pixels Pix. Electrically-insulating blocks 97 are interposed between conductive strips 62 and 66 at the intersections between conductive strips.

FIGS. 19A to 19J are partial simplified cross-section views of structures obtained at successive steps of another embodiment of a method of manufacturing the optoelectronic device of FIG. 95 shown in FIGS. 17, 18A, and 18B.

The present embodiment of the manufacturing method comprises the steps of:

forming semiconductor layers 72, 74, 76 on support 70 (FIG. 19A) as previously described in relation with FIG. 14A;

forming light-emitting diodes LED and conductive pads 42 (FIG. 19B) as previously described in relation with FIG. 14B and forming connection element 92;

bonding electronic circuit 80 (FIG. 19C), as previously described in relation with FIG. 14C, electronic circuit 80 particularly comprising conductive area 100 on the side of surface 32;

forming walls 46 (FIG. 19D) as previously described in relation with FIG. 14D and separating optoelectronic circuits 40;

forming photoluminescent blocks 44 (FIG. 19E) as previously described in relation with FIG. 14E;

forming insulating layer 56 on the lateral walls of each optoelectronic circuit 40 (FIG. 19F) as previously described in relation with FIG. 15B;

forming insulating layer 94 covering, for each optoelectronic circuit 40, photoluminescent blocks 44 and walls 46 and bonding a handle 84 (FIG. 19G) as previously described in relation with FIG. 14F;

thinning the substrate of electronic circuit 80, forming vias 57 and 96, and forming conductive pads 34 and 98 (FIG. 19H) as previously described in relation with FIGS. 14G and 14H;

separating electronic circuits 30 (FIG. 19I) and forming insulating layers 56 on the lateral walls of electronic circuits 30 as previously described in relation with FIG. 15B; and bonding some of display pixels Pix to support 12 (FIG. 19J) as previously described in relation with FIG. 14J, with the difference that conductive pads 34 come into contact with conductive strips 62 and that conductive pads 98 come into contact with conductive strips 66.

Specific embodiments have been described. Various alterations and modifications will readily occur to those skilled in the art. Further, various embodiments with various variations have been described hereabove. It should be noted that various elements of these various embodiments and variations may be combined.

The invention claimed is:

1. An optoelectronic device comprising:
a support;
at least one first electrically-conductive layer covering the support;
display pixel circuits bonded to the first electrically-conductive layer, each display pixel circuit comprising first and second opposite surfaces, a respective electronic circuit, and a respective optoelectronic circuit, the electronic circuit comprising the first surface and a third surface opposite to the first surface, the first surface being bonded to the first electrically-conductive layer, the optoelectronic circuit being bonded to the third surface and comprising at least two light-emitting diodes, each light emitting diode comprising electrodes, at least one of the electrodes of each light-emitting diode being connected to the electronic circuit by the third surface, the optoelectronic circuit further comprising photoluminescent blocks covering the light-emitting diodes and electrically-conductive or semiconductor walls surrounding the photoluminescent blocks; and
at least one second electrically-conductive layer electrically coupled to at least one of the display pixel circuits.

2. The optoelectronic device of claim 1, wherein the second electrically-conductive layer at least partially covers said at least one of the display pixel circuits.

3. The optoelectronic device of claim 2, wherein the second electrically-conductive layer is electrically coupled to the walls of said at least one of the display pixel circuits.

4. The optoelectronic device of claim 1, wherein the second electrically-conductive layer is, for at least one of the display pixel circuits, in contact with an electrically-conductive pad of the electronic circuit located on a side of the third surface.

5. The optoelectronic device of claim 1, wherein the second electrically-conductive layer extends on the support and wherein the second electrically-conductive layer is, for said at least one of the display pixel circuits, in contact with an electrically-conductive pad of the electronic circuit located on a side of the first surface.

6. The optoelectronic device of claim 1, further comprising a first electrically-insulating layer covering the first electrically-conductive layer between the display pixel circuits and interposed between the first electrically-insulating layer and the second electrically-conductive layer.

7. The optoelectronic device of claim 1, further comprising, for each display pixel circuit, a second electrically-insulating layer covering sides of the display pixel circuit.

8. The optoelectronic device of claim 1, wherein, for each display pixel circuit, the optoelectronic circuit of the display pixel circuit comprises a first semiconductor layer supporting the walls and the photoluminescent blocks and, for each light-emitting diode, a stack resting on the first semiconductor layer on a side opposite to the photoluminescent blocks and comprising a second doped semiconductor layer of a first conductivity type, an active layer, and a third doped semiconductor layer of a second conductivity type opposite to the first conductivity type, the stacks being distinct.

9. The optoelectronic device of claim 8, wherein each display pixel circuit comprises, for each stack, a conductive pad in contact with the first semiconductor layer and bonded to the electronic circuit of the display pixel circuit.

10. The optoelectronic device of claim 1, comprising at least two first separate electrically-conductive layers covering the support, display pixel circuits-among the display pixel circuits being bonded to each first electrically-conductive layer, the device further comprising at least two second electrically-conductive layers, each being electrically coupled to electronic circuits among the display pixel circuits.

11. The optoelectronic device of claim 10, wherein the first two electrically-conductive layers and the second two electrically-conductive layers have a shape of parallel strips.

12. A method of manufacturing an optoelectronic device, comprising the steps of:
   a) manufacturing display pixel circuits, comprising first and second opposite surfaces, and each comprising a respective electronic circuit and a respective optoelectronic circuit, the electronic circuit comprising the first surface and a third surface opposite to the first surface, the optoelectronic circuit being bonded to the third surface and comprising at least two light-emitting diodes, each light emitting diode comprising electrodes, at least one of the electrodes of each light-emitting diode being connected to the electronic circuit by the third surface, the optoelectronic circuit further comprising photoluminescent blocks covering the light-emitting diodes and electrically-conductive or semiconductor walls surrounding the photoluminescent blocks;
   b) manufacturing a support covered with at least one first electrically-conductive layer;
   c) bonding the first surface of the electronic circuit of each display pixel circuit to the first electrically-conductive layer; and
   d) forming at least one second electrically-conductive layer electrically coupled to at least one of the display pixel circuits.

13. The method of claim 12, wherein the second electrically-conductive layer at least partially covers said at least one of the display pixel circuits.

14. The method of claim 13, wherein the second electrically-conductive layer is electrically coupled to the walls of said at least one of the display pixel circuits.

15. The method of claim 12, wherein the second electrically-conductive layer is, for said at least one of the display pixel circuits, in contact with an electrically-conductive pad of the electronic circuit located on a side of the third surface.

16. The optoelectronic method of claim 13, wherein the second electrically-conductive layer extends on the support and wherein the second electrically-conductive layer is, for said at least one of the display pixel circuits, in contact with an electrically-conductive pad of the electronic circuit located on a side of the first surface.

17. The method of claim 13, comprising, between steps c) and d), the step of forming a first electrically-insulating layer covering the first electrically-conductive layer between the display pixel circuits and interposed between the first electrically-insulating layer and the second electrically-conductive layer.

18. The method of claim 13, comprising, before step c), the step of forming, for each display pixel circuit, further, a second electrically-insulating layer covering sides of the display pixel circuit.

19. The method of claim 13, wherein step a) comprises forming, for each light-emitting diode, a stack resting on a first semiconductor layer and comprising a second doped semiconductor layer of a first conductive type, an active layer, and a third doped semiconductor layer of a second conductivity type opposite to the first conductivity type, the stacks being distinct.

* * * * *